(12) United States Patent
Sato et al.

(10) Patent No.: US 11,415,696 B2
(45) Date of Patent: Aug. 16, 2022

(54) OPTICAL SENSOR AND ELECTRONIC DEVICE

(71) Applicant: SHARP KABUSHIKI KAISHA, Sakai (JP)

(72) Inventors: Hideki Sato, Sakai (JP); Takuma Hiramatsu, Sakai (JP); Takayuki Shimizu, Sakai (JP); Yoshiki Ikuta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 509 days.

(21) Appl. No.: 16/613,999

(22) PCT Filed: Mar. 14, 2018

(86) PCT No.: PCT/JP2018/009935
§ 371 (c)(1),
(2) Date: Nov. 15, 2019

(87) PCT Pub. No.: WO2018/211801
PCT Pub. Date: Nov. 22, 2018

(65) Prior Publication Data
US 2020/0088875 A1 Mar. 19, 2020

(30) Foreign Application Priority Data
May 19, 2017 (JP) .............................. JP2017-100160

(51) Int. Cl.
*G01S 17/10* (2020.01)
*G01S 7/4861* (2020.01)
*G01S 7/4865* (2020.01)
*H01L 31/107* (2006.01)

(52) U.S. Cl.
CPC ............ *G01S 17/10* (2013.01); *G01S 7/4861* (2013.01); *G01S 7/4865* (2013.01); *H01L 31/107* (2013.01)

(58) Field of Classification Search
CPC ...... G01S 17/10; G01S 7/4861; G01S 7/4865; G01S 7/487; H01L 31/107; G01V 8/12
See application file for complete search history.

(56) References Cited

U.S. PATENT DOCUMENTS 3,765,774 A * 10/1973 Petrohilos .............. G01B 11/10
250/559.19
2014/0231631 A1 8/2014 Moore et al.
2016/0033644 A1 2/2016 Moore

FOREIGN PATENT DOCUMENTS

JP 6020547 B2 11/2016

\* cited by examiner

*Primary Examiner* — Thanh Luu
*Assistant Examiner* — Monica T Taba
(74) *Attorney, Agent, or Firm* — ScienBiziP, P.C.

(57) ABSTRACT

An optical sensor for appropriately updating a crosstalk value is provided with: a photon-counting type of first light-receiving unit for receiving target object reflected light and cover panel reflected light; and a determination circuit that determines whether or not the target object reflected light is received by the first light-receiving unit, on the basis of a first received light pulse signal that is based on at least one of the target object reflected light and the cover panel reflected light, and a reference pulse signal.

9 Claims, 16 Drawing Sheets

FIG.15
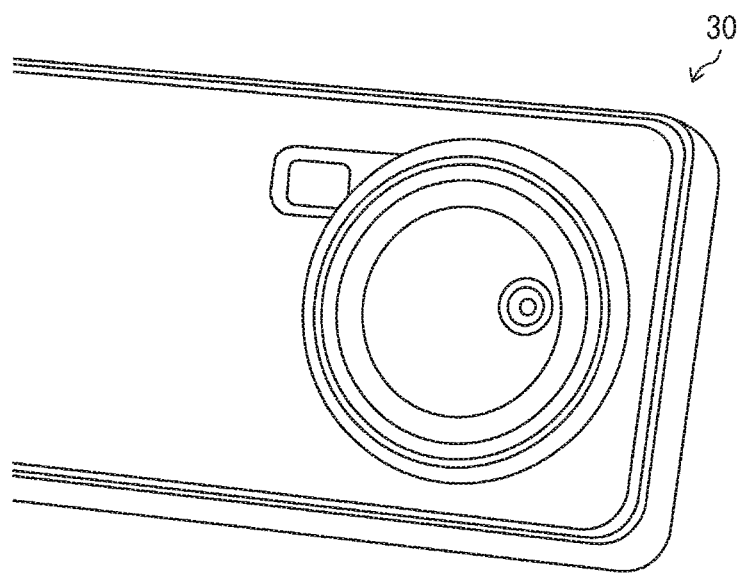
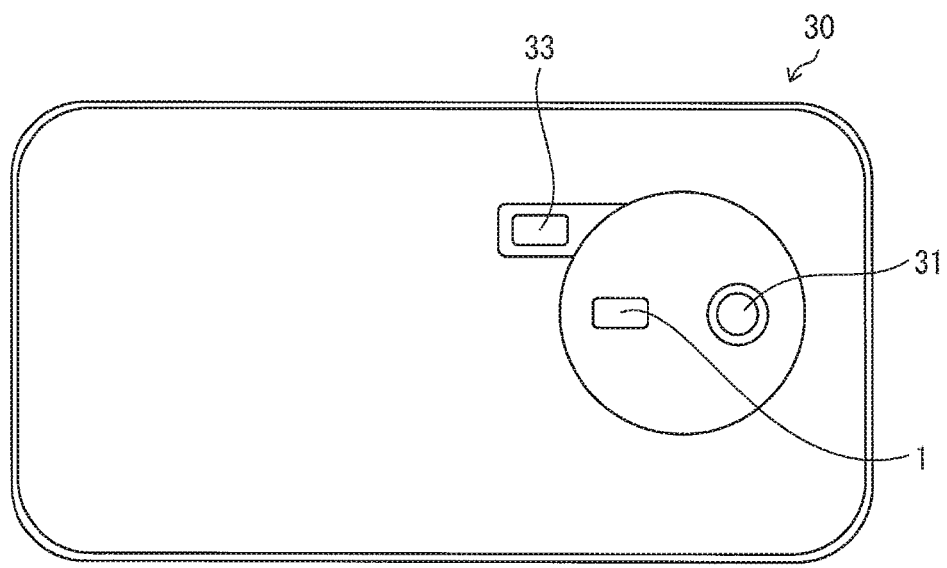

OPTICAL SENSOR AND ELECTRONIC DEVICE

TECHNICAL FIELD

The present invention relates to an optical sensor and an electronic device with which the distance to a target object is measured based on time-of-flight (TOF).

BACKGROUND ART

There is conventionally known time-of-flight (TOF) technology in which avalanche photodiodes that employ the avalanche amplification effect of photodiodes are used as light-receiving elements that detect faint light at high speed (PTL 1 and PTL 2).

An avalanche photodiode operates in a linear mode when a reverse bias voltage that is lower than the breakdown voltage is applied, and the output current fluctuates in such a way that there is a positive correlation with the amount of received light. Meanwhile, an avalanche photodiode operates in a Geiger mode when a reverse bias voltage that is greater than or equal to the breakdown voltage is applied. A Geiger-mode avalanche photodiode causes an avalanche phenomenon even when a single photon is incident, and therefore a large output current can be obtained. Consequently, a Geiger-mode avalanche photodiode is referred to as a single-photon avalanche diode (SPAD).

A pulse output that is synchronized with photon incidence can be obtained by adding a quenching resistance in series to a Geiger-mode avalanche photodiode.

FIG. 16 is a circuit diagram depicting an example configuration of a light-receiving unit that uses a Geiger-mode avalanche photodiode. The light-receiving unit is configured of a photodiode PD15, an active quenching resistance R15 (a resistance component of a MOS transistor), and a buffer BUF15.

The photodiode PD15 is a Geiger-mode avalanche photodiode, and when a bias voltage that is greater than or equal to the breakdown voltage is applied, an avalanche phenomenon occurs with respect to the incidence of a single photon and current flows. Current flows to the active quenching resistance R15 connected in series to the photodiode PD15, and therefore the inter-terminal voltage of the active quenching resistance R15 increases, accordingly the bias voltage of the photodiode PD15 drops, and the avalanche phenomenon stops. When the current produced by the avalanche phenomenon is no longer present, the inter-terminal voltage of the active quenching resistance R15 drops, and the photodiode PD15 returns to a state in which a bias voltage that is greater than or equal to the breakdown voltage is applied once again. Due to the buffer BUF15, changes in voltage between the photodiode PD15 and the active quenching resistance R15 are extracted as pulse outputs that are synchronized with photon incidence.

A TOF sensor measures the distance between the TOF sensor and a target object by calculating the distance on the basis of the time difference between the time at which light is emitted toward the target object and the time at which reflected light, produced by the emitted light being reflected by the target object, is received.

PTL 1 discloses a distance measurement method in which reflected light emitted from a light-emitting element and reflected by a target object and direct light from the light-emitting element are respectively input to two separate delay-locked loop circuits (DLL circuits), and the amount of phase delay between two DLL output pulses is converted into a digital value.

PTL 2 discloses a method with which distance measurement is carried out by obtaining the maximum value of a histogram of the output pulse incidence from a SPAD.

CITATION LIST

Patent Literature

PTL 1: U.S. Patent Application Publication No. 2014/0231631 (published on Aug. 21, 2014)
PTL 2: Specification of Japanese Patent No. 6020547 (registered on Oct. 14, 2016)

SUMMARY OF INVENTION

Technical Problem

When mounted on an electronic device, a TOF sensor is often provided with a cover panel that transmits a portion of the light emitted from a light-emitting element and reflects the remaining portion near the front of the optical sensor light-receiving/emitting surfaces.

In the distance measurement method disclosed in PTL 1, light pulses from the light-emitting element become not only reflected light from the detection target object but also reflected light from a cover panel, and therefore the DLL circuit to which signals that are based on the reflected light are to be input has a signal that is based on the reflected light from the detection target object and a signal that is based on the reflected light from the cover panel input thereto in a mixed state. Therefore, the DLL circuits within the TOF sensor erroneously recognize that the detection target object is present at a distance between the position of the detection target object and the position of the cover panel (the distance from the TOF sensor is approximately zero), and calculate an erroneous distance.

Furthermore, in the distance measurement method using a histogram disclosed in PTL 2, it is possible to separate signal components that are based on reflected light from a cover panel and signal components that are based on reflected light from a detection target object and to correctly measure the distance to the detection target object. However, there is a disadvantage in terms of resolution compared to the DLL circuit scheme. In order to achieve a high resolution, a light-emission pulse of a width close to the resolution is required and the number of bins in the histogram increases, and therefore there is a drawback in that there is an increase in cost due to the process and circuit scale.

In distance measurement using the DLL circuit scheme, if it is possible to know the amount of the reflected light components from the cover panel (crosstalk value), it is possible to perform a calculation that corrects the erroneous distance to the correct distance. However, the crosstalk value changes due to fingerprint stains or the like on the cover panel, and it is therefore necessary to periodically update the crosstalk value.

The crosstalk value is obtained by counting the number of SPAD output pulses for reflected light components in a fixed period, in a state in which there are no reflected light components produced by the target object other than reflected light components from the cover panel in front of the TOF sensor. Even in a case where the target object is located at a distance farther than the distance that can be detected by the TOF sensor, the number of SPAD output pulses increases by a finite number due to reflected light components produced by the target object, and therefore the crosstalk value cannot be calculated correctly. It is therefore necessary to determine whether or not there are reflected light components produced by the target object up to a distance that is sufficiently further than the distance that can be detected by the TOF sensor.

One aspect of the present invention aims to provide an optical sensor and an electronic device with which it is possible to appropriately measure the distance to a target object on the basis of time-of-flight, by appropriately updating a crosstalk value representing the amount of components of cover panel reflected light.

Solution to Problem

In order to solve the aforementioned problem, an optical sensor according to one aspect of the present invention is provided with: a reference pulse generation circuit that generates a reference pulse signal; a light-emitting element that emits light toward a target object on the basis of the reference pulse signal generated by the reference pulse generation circuit; a cover panel that transmits a portion of the light emitted from the light-emitting element and reflects the remaining portion; a photon-counting type of first light-receiving element that is provided in such a way as to be able to receive target object reflected light that is reflected by the target object and cover panel reflected light that is reflected by the cover panel; and a determination circuit that determines whether or not the target object reflected light is received by the first light-receiving element, on the basis of a first received light pulse signal that is based on at least one of the target object reflected light and the cover panel reflected light received by the first light-receiving element, and the reference pulse signal.

Advantageous Effects of Invention

According to one aspect of the present invention, it is possible to appropriately measure the distance to a target object on the basis of time-of-flight, by appropriately updating a crosstalk value representing the amount of components of cover panel reflected light.

BRIEF DESCRIPTION OF DRAWINGS

FIG. 5(a) is a waveform chart depicting a first received light pulse signal from the first light-receiving unit, FIG. 5(b) is a waveform chart depicting the first received light pulse signal from the first light-receiving unit in a light emission period and a non-light emission period, and FIG. 5(c) is a drawing for illustrating an operation of the optical sensor that is based on a reference pulse signal in the actual measurement period.

FIG. 15(a) is a perspective view depicting the external appearance of a smartphone according to embodiment 3, and FIG. 15(b) is a front view of the smartphone.

DESCRIPTION OF EMBODIMENTS

Hereinafter, embodiments of the present invention will be described in detail.

Embodiment 1

(Configuration of Optical Sensor 1)

Figure 1:
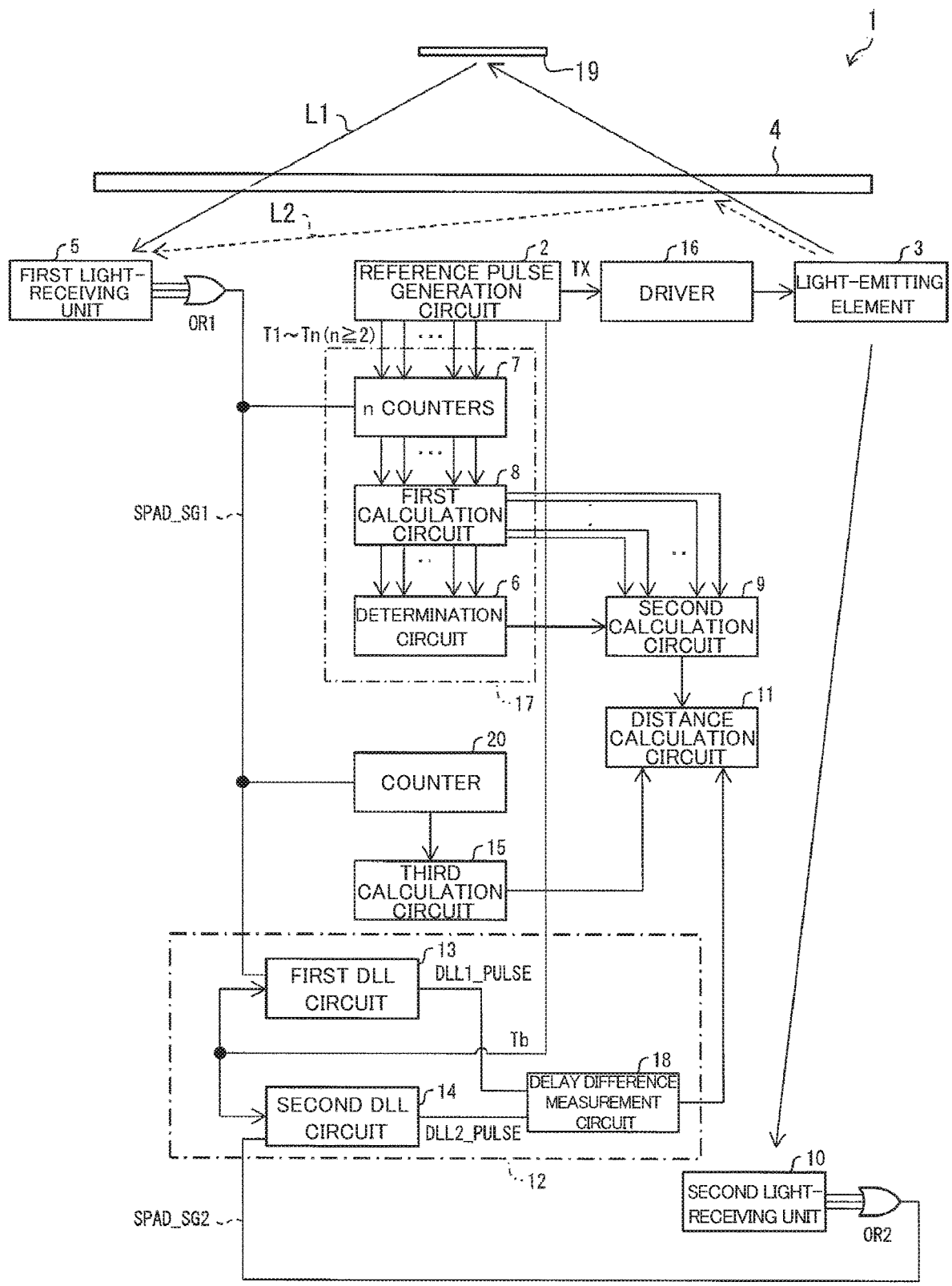
FIG. 1 is a block diagram schematically depicting the configuration of an optical sensor according to embodiment 1.

FIG. 1 is a block diagram schematically depicting the configuration of an optical sensor 1 according to embodiment 1. The optical sensor 1 is provided with: a reference pulse generation circuit 2 that generates a reference pulse signal TX; a light-emitting element 3 that emits light toward a target object 19 on the basis of the reference pulse signal TX generated by the reference pulse generation circuit 2; a cover panel 4 that transmits a portion of the light emitted from the light-emitting element 3 and reflects the remaining portion; and a photon-counting type of first light-receiving unit 5 (first light-receiving element) that is provided in such a way as to be able to receive target object reflected light L1 reflected by the target object 19 and cover panel reflected light L2 reflected by the cover panel 4. The reference pulse generation circuit 2 supplies the generated reference pulse signal TX to a driver 16. The driver 16 pulse-drives the light-emitting element 3 on the basis of the reference pulse signal TX supplied from the reference pulse generation circuit 2.

The optical sensor 1 is provided with a target object determination circuit 17 (determination circuit) that determines whether or not the target object reflected light L1 is received by the first light-receiving unit 5, on the basis of a first received light pulse signal SPAD_SG1 that is based on at least one of the target object reflected light L1 and the cover panel reflected light L2 received by the first light-receiving unit 5, and the reference pulse signal TX.

The target object determination circuit 17 has: n counters 7 that count the number of first received light pulse signals SPAD_SG1 from the first light-receiving unit 5 in each of a first period t1 to an $n^{th}$ period to obtained by dividing a reference cycle Tb of the reference pulse signal TX into n equal parts (n being an integer that is greater than or equal to 2); a first calculation circuit 8 that calculates, for each of m types of different frequency conditions for the reference pulse signal TX, a number of third output pulses P3 obtained by subtracting a number of second output pulses P2 representing the number of first received light pulse signals SPAD_SG1 counted by the n counters 7 in the first period t1 to the $n^{th}$ period tn included in a non-light emission period T4 in which the light-emitting element 3 does not emit light, from a number of first output pulses P1 representing the number of first received light pulse signals SPAD_SG1 counted by the n counters 7 in the first period t1 to the $n^{th}$ period tn included in a light emission period T3 in which the light-emitting element 3 emits light on the basis of the reference pulse signal TX; and a determination circuit 6 that determines whether or not the target object reflected light L1 is received by the first light-receiving unit 5, on the basis of m types of the number of third output pulses P3 for each of the m types of different frequency conditions for the reference pulse signal TX calculated by the first calculation circuit 8.

The optical sensor 1 operates in an actual measurement period T1 in which the distance to the target object 19 is measured, and a determination period T2 in which it is determined whether or not the target object reflected light L1 is received by the first light-receiving unit 5. In the determination period T2, it is determined whether or not there are components of the target object reflected light L1 produced by the target object 19 other than components of the cover panel reflected light L2 produced by the cover panel 4. Then, in a case where it is determined that there are no components of the target object reflected light L1, a crosstalk value is calculated and updated. The timing at which the determination period T2 is implemented may be arbitrarily set in accordance with the usage environment of the optical sensor 1.

The first period t1 to the $n^{th}$ period to obtained by dividing the reference cycle Tb into n equal parts are generated by dividing by a pulse waveform of a cycle that is 1/n of the reference cycle Tb.

The first calculation circuit 8 calculates the number of third output pulses P3 obtained by subtracting the number of second output pulses P2 from the number of first output pulses P1, on the basis of a ratio between the length of the light emission period T3 and the length of the non-light emission period T4.

The optical sensor 1 is further provided with a second calculation circuit 9 that calculates a crosstalk value representing the amount of components of the cover panel reflected light L2, on the basis of the number of third output pulses P3 corresponding to a period in which there is a first received light pulse signal SPAD_SG1 that is based on the cover panel reflected light L2, within the first period t1 to the $n^{th}$ period tn. The second calculation circuit 9 calculates and updates the crosstalk value when it is determined by the determination circuit 6 that the target object reflected light L1 has not been received by the first light-receiving unit 5.

The optical sensor 1 is further provided with: a photon-counting type of second light-receiving unit 10 that is arranged nearer to the light-emitting element 3 than the first light-receiving unit 5 and receives the cover panel reflected light L2 and sensor package internal reflected light (including direct light from the light-emitting element); and a time difference extraction circuit 12 that extracts a time difference corresponding to the distance on a spatial optical path to the target object 19, including a first DLL circuit 13 having input thereto the first received light pulse signal SPAD_SG1 from the first light-receiving unit 5 and the reference cycle Tb that is based on the reference pulse signal TX, and a second DLL circuit 14 having input thereto a second received light pulse signal SPAD_SG2 from the second light-receiving unit 10 and the reference cycle Tb.

The optical sensor 1 is further provided with: a third calculation circuit 15 that calculates a number of sixth output pulses P6 obtained by subtracting a number of fifth output pulses P5 representing the number of first received light pulse signals SPAD_SG1 from the first light-receiving unit 5 having received external disturbance light in the non-light emission period T4, from a number of fourth output pulses P4 representing the number of first received light pulse signals SPAD_SG1 from the first light-receiving unit 5 having received target object reflected light L1 including external disturbance light and the cover panel reflected light L2 in the light emission period T3, in the actual measurement period T1; and a distance calculation circuit 11 that calculate the distance to the target object 19 on the basis of the number of sixth output pulses P6 calculated by the third calculation circuit 15, the time difference extracted by the time difference extraction circuit 12, and the crosstalk value calculated by the second calculation circuit 9. The number of fourth output pulses P4 and the number of fifth output pulses P5 are counted by a counter 20.

The target object 19 is a detection target object for detecting the distance to the optical sensor 1. However, the target object 19 may be a non-detection target object arranged in the direction of light emitted from the light-emitting element 3. A non-detection target object, for example, can be an object such as a wall or a chest-of-drawers arranged to the rear of a detection target object.

The third calculation circuit 15 calculates the number of sixth output pulses P6 obtained by subtracting the number of fifth output pulses P5 from the number of fourth output pulses P4, on the basis of a ratio between the length of the light emission period T3 and the length of the non-light emission period T4.

(Actual Measurement Period T1)

The optical sensor 1 having the aforementioned configuration obtains the distance to the target object 19 to be detected which reflects light from the light-emitting element 3, as described below, in the "actual measurement period T1".

First, a description will be given regarding a case where the cover panel 4 is not present near the front of the light-receiving/emitting surfaces pertaining to the light-emitting element 3 and the first light-receiving unit 5 provided in the optical sensor 1.

Pulsed light is emitted from the light-emitting element 3. Then, target object reflected light L1 from the target object 19 to be detected is incident on the first light-receiving unit 5, and reflected light (including direct light the light-emitting element 3) from inside the package of the optical sensor 1 is incident on the second light-receiving unit 10. The first received light pulse signal SPAD_SG1 is output from the first light-receiving unit 5, and the second received light pulse signal SPAD_SG2 is output from the second light-receiving unit 10, at an incidence corresponding to the amount of reflected light that is incident.

The first received light pulse signal SPAD_SG1 and the second received light pulse signal SPAD_SG2 are input to the time difference extraction circuit 12 as pulse signals having a time difference corresponding to a difference in distance on the spatial optical path. The second received light pulse signal SPAD_SG2 that is output from the second light-receiving unit 10 can be deemed to have a distance on the spatial optical path that is approximately zero. Therefore, the time difference extraction circuit 12 extracts a time difference corresponding to a distance on the spatial optical path using these two inputs (the first received light pulse signal SPAD_SG1 and the second received light pulse signal SPAD_SG2) and the reference cycle Tb of the reference pulse signal TX generated by the reference pulse generation circuit 2, and obtains the distance to the target object 19 to be detected.

Furthermore, with respect to received light that is based on light emitted from the light-emitting element 3, the first received light pulse signal SPAD_SG1 from the first light-receiving unit 5 and the second received light pulse signal SPAD_SG2 from the second light-receiving unit 10 are generated in a temporally random manner within the light emission width. Therefore, the first DLL circuit 13 and the second DLL circuit 14 which are DLL (delay locked loop) circuits are used for the time difference extraction circuit 12. Then, the output of the first DLL circuit 13 is locked to the center of the received light width of the first light-receiving unit 5, the output of the second DLL circuit 14 is locked to the center of the received light width of the second light-receiving unit 10, and the time difference is thereby extracted.

(Configuration of First Light-Receiving Unit 5)

Figure 2:
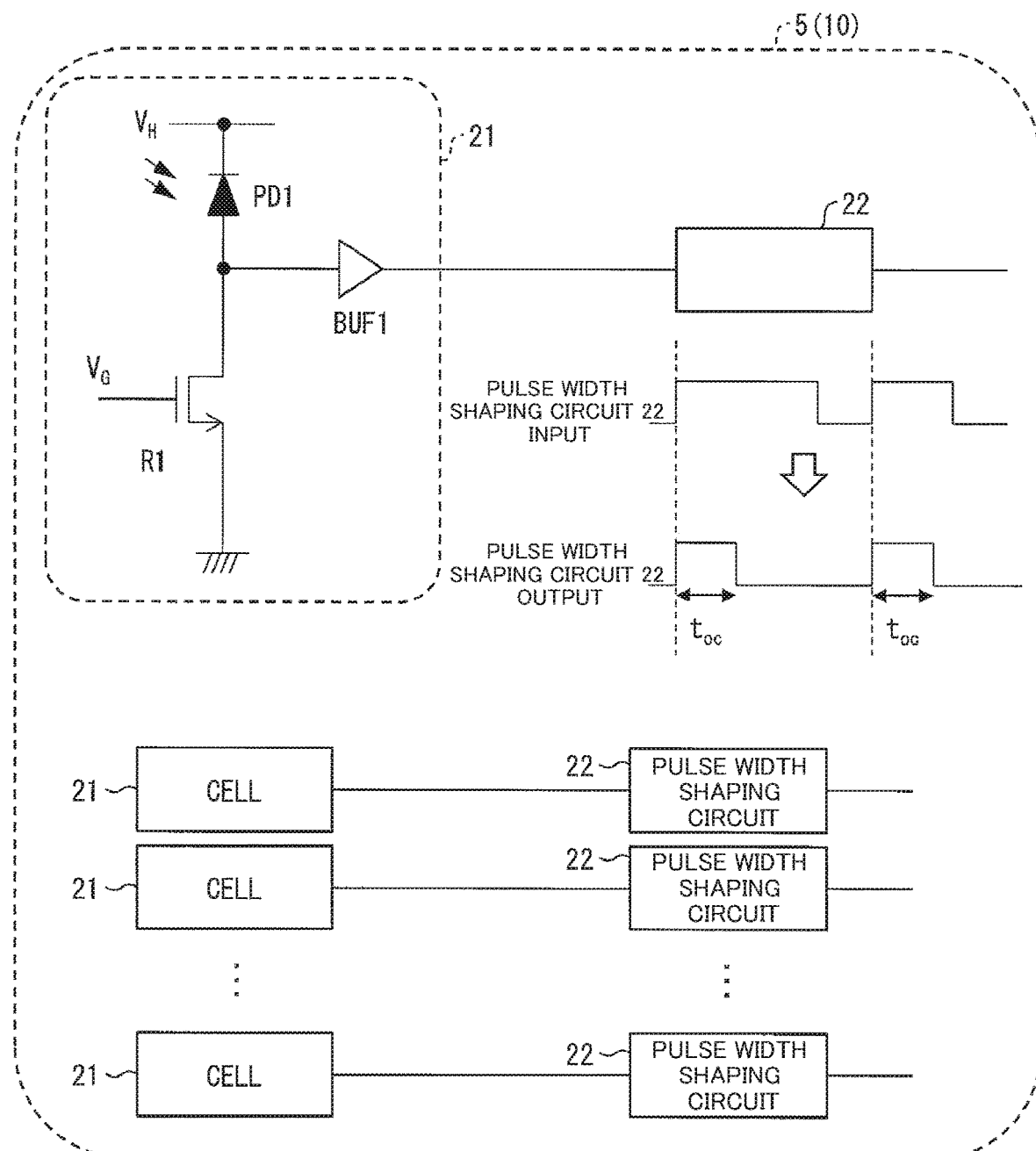
FIG. 2 is a circuit diagram schematically depicting the configuration of a first light-receiving unit provided in the optical sensor.

FIG. 2 is a circuit diagram schematically depicting the configuration of the first light-receiving unit 5 provided in the optical sensor 1. Here, the configurations of the first light-receiving unit 5 and the second light-receiving unit 10 are the same, and therefore the first light-receiving unit 5 will be described as an example.

As depicted in FIG. 2, the first light-receiving unit 5 has a plurality of cells 21 configured of a photodiode PD1, an active quenching resistance R1 (resistance component of a MOS transistor), and a buffer BUF1.

The photodiode PD1 is a Geiger-mode avalanche photodiode. Then, the amount of incident light that is incident on the photodiode PD1 is extracted as a pulse output (the first received light pulse signal SPAD_SG1) by the active quenching resistance R1 and the buffer BUF1. The pulse output from the first light-receiving unit 5 passes through a pulse width shaping circuit 22 and the pulse width is shaped to a fixed time width toc, after which an OR operation is carried out by an arithmetic unit OR1 (FIG. 1).

(Configuration of First DLL Circuit 13)

Figure 3:
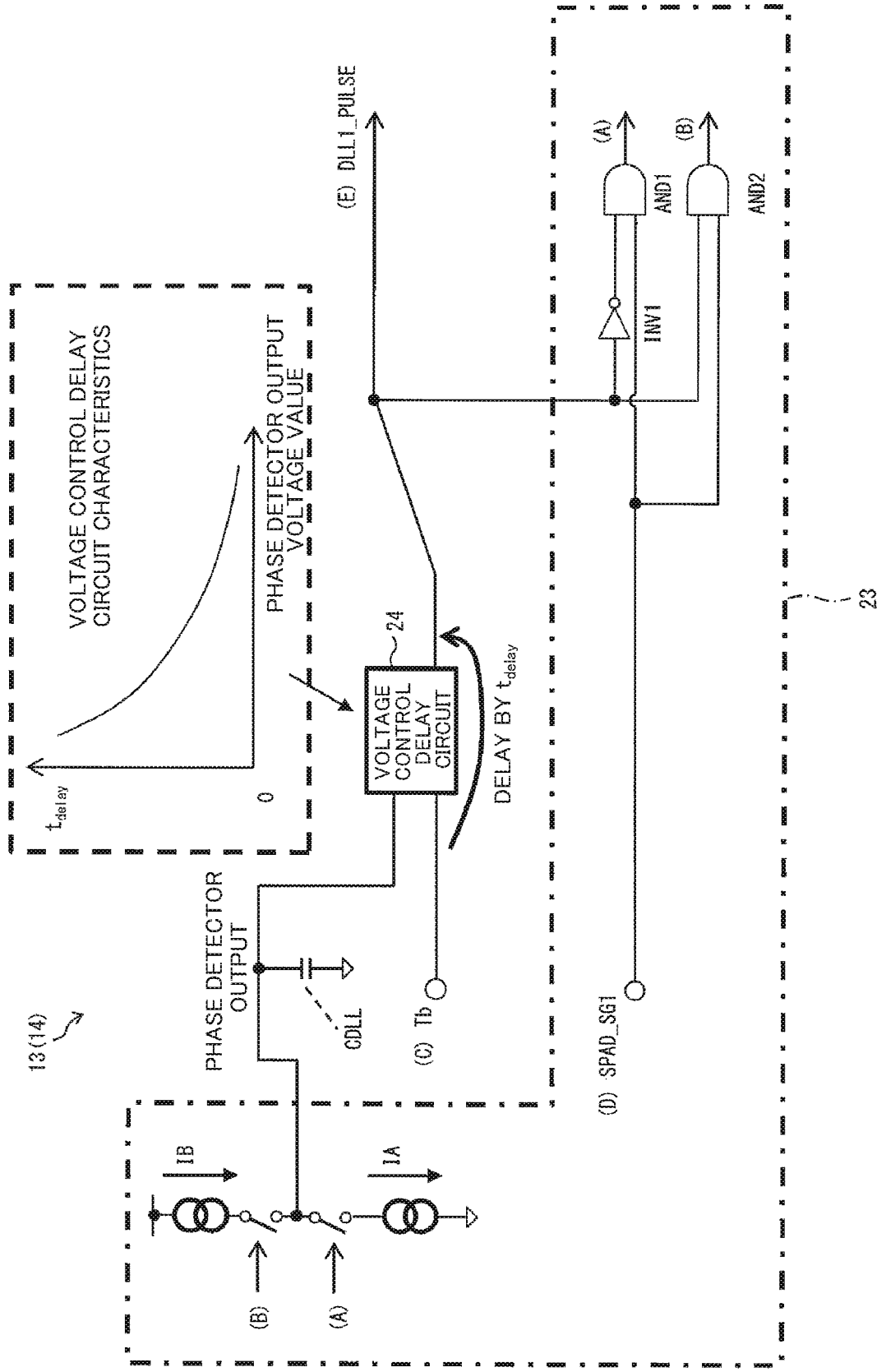
FIG. 3 is a circuit diagram schematically depicting the configuration of a first DLL circuit provided in the optical sensor.

FIG. 3 is a circuit diagram schematically depicting the configuration of the first DLL circuit 13 provided in the time difference extraction circuit 12 of the optical sensor 1. The first DLL circuit 13 and the second DLL circuit 14 have the same configuration, and therefore the first DLL circuit 13 will be described hereinafter. As depicted in FIG. 3, the first DLL circuit 13 has a phase detector 23, a voltage control delay circuit 24, and a capacitance element CDLL that retains a control voltage of the voltage control delay circuit 24.

The phase detector 23 is provided with arithmetic units AND1 and AND2 and an inverter INV1. Due to an operation performed by the arithmetic unit AND2, a signal (B) is equal to 1 and a current IB flows to the capacitance CDLL when (E) a delay signal DLL1_PULSE supplied from the voltage control delay circuit 24 is equal to 1 and (D) the first received light pulse signal SPAD_SG1 is equal to 1. Due to operations of the arithmetic unit AND1 and the inverter INV1, a signal (A) is equal to 1 and a current IA flows from the capacitance CDLL when (E) the delay signal DLL1_PULSE is equal to 0 and (D) the first received light pulse signal SPAD_SG1 is equal to 1. The input voltage of the voltage control delay circuit 24 is decided according to the voltage of the capacitance element CDLL by means of the aforementioned operations, and a waveform in which the (C) reference cycle Tb (duty of 50%) is delayed by an amount commensurate with $t_{delay}$ becomes the (E) delay signal DLL1_PULSE.

(D) In a case where external disturbance light components other than received light originating in the light-emitting element 3 are included in the first received light pulse signal SPAD_SG1 in a uniform manner, with sufficient time integration the current IA=IB, and the external disturbance light components can therefore be removed. It should be noted that the second DLL circuit 14 within the time difference extraction circuit 12 has the same configuration as the first DLL circuit 13.

(Operation of First DLL Circuit 13)

Figure 4:
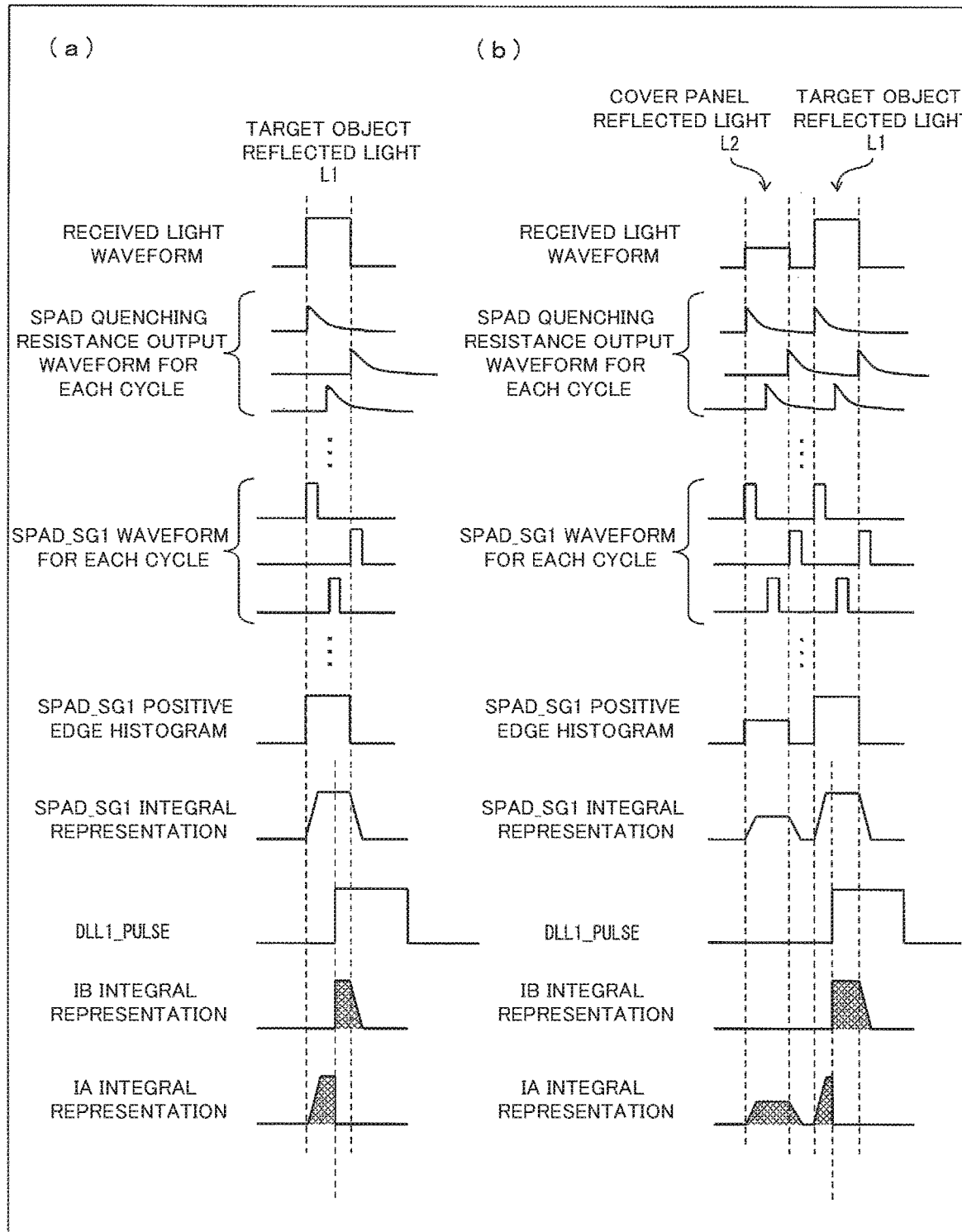
FIGS. 4(a) and (b) are waveform charts depicting the operation of the first DLL circuit.

FIGS. 4(a) and (b) are waveform charts depicting the operation of the first DLL circuit 13. The operations of the first DLL circuit 13 and the second DLL circuit 14 are the same, and therefore the operation of the first DLL circuit 13 will be described as an example. FIG. 4(a) is a waveform chart depicting a lock state of the first DLL circuit 13.

As depicted in FIG. 4(a), with respect to the waveform produced when the first light-receiving unit 5 has received the target object reflected light L1 (received light waveform), an integral value for IB in the IB integral representation in FIG. 4(a) and an integral value for IA in the IA integral representation in FIG. 4(a) coincide in a case where a rising edge of the delay signal DLL1_PULSE has occurred in a location where a waveform obtained by integrating the waveforms of randomly generated first received light pulse signals SPAD_SG1 is divided equally into two. Therefore, this state becomes a lock state.

(Operation of Optical Sensor 1 in Actual Measurement Period T1)

Figure 5:
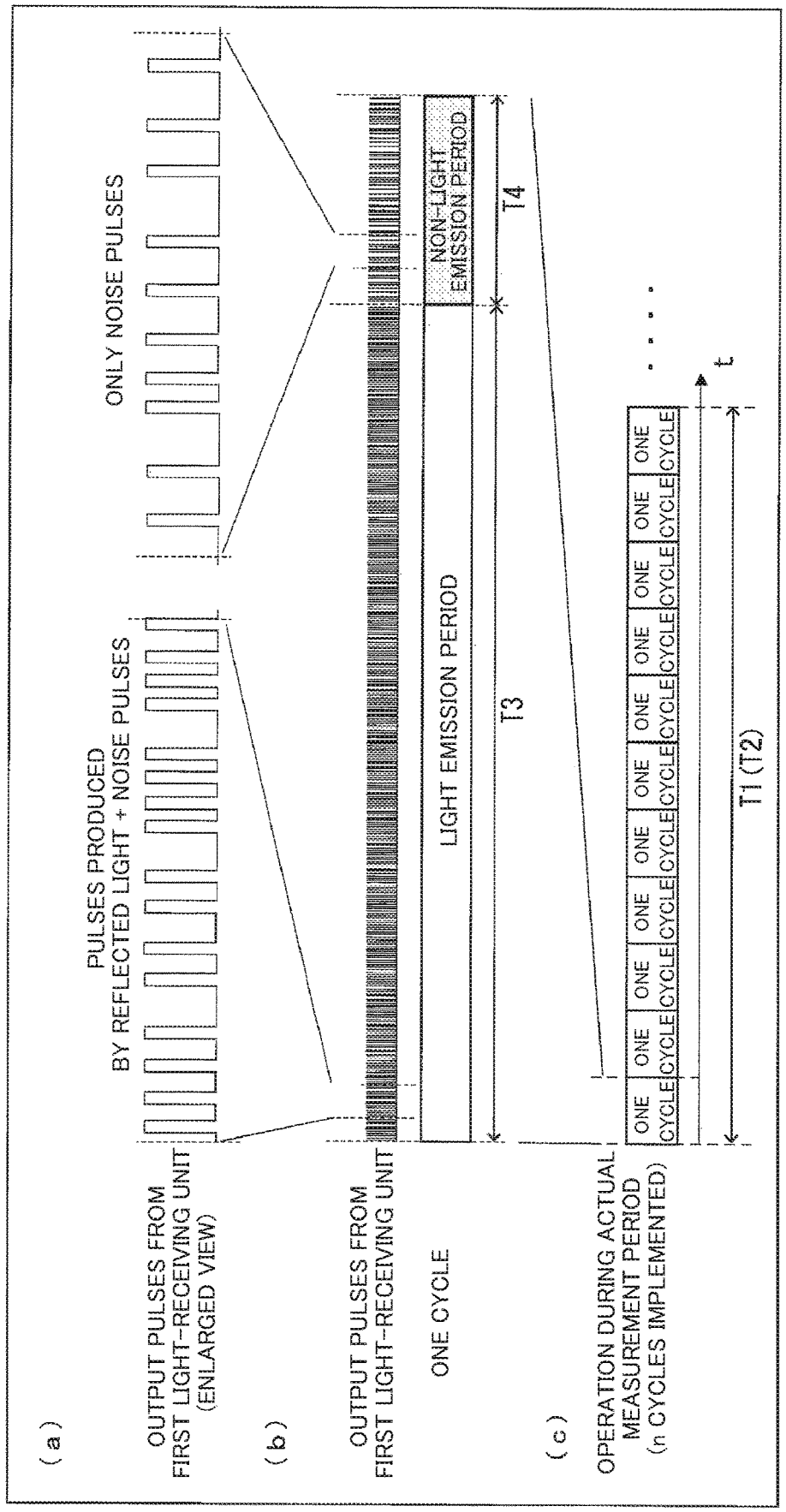
FIG. 5 is a drawing for describing the operating state of the optical sensor in an actual measurement period.

FIG. 5 is a drawing for describing the operating state of the optical sensor 1 in the actual measurement period T1, FIG. 5(a) is a waveform chart depicting the first received light pulse signals SPAD_SG1 from the first light-receiving unit 5, FIG. 5(b) is a waveform chart depicting the first received light pulse signals SPAD_SG1 from the first light-receiving unit 5 in the light emission period T3 and the non-light emission period T4, and FIG. 5(c) is a drawing for illustrating an operation of the optical sensor 1 that is based on the reference pulse signal TX in the actual measurement period T1.

In the actual measurement period T1, the light-emitting element 3 repeats the light emission period T3 and the non-light emission period T4. FIG. 5(b) depicts output pulses from the first light-receiving unit 5 for one cycle included in the actual measurement period T1, and FIG. 5(a) is a partial enlarged view of FIG. 5(b). FIG. 5(c) depicts the entire operation in the actual measurement period T1. It should be noted that a similar operation is also carried out in the second light-receiving unit 10. Furthermore, a similar operation is also carried out in the determination period T2.

The light emission period T3 and the non-light emission period T4 of the light-emitting element 3 in the actual measurement period T1 are set so that the light emission period T3 is greater than the non-light emission period T4, as depicted in FIG. 5(b). Furthermore, in the optical sensor 1, in the entire actual measurement period T1 as depicted in FIG. 5(c), the operation is repeated with one cycle being a period that is implemented with a fixed time ratio (light emission period:non-light emission period=T3:T4). It is desirable for one cycle to be set to be as short as possible to the extent that the environment in the light emission period T3 and the environment in the non-light emission period T4 do not change. The first received light pulse signals SPAD_SG1 output from the first light-receiving unit 5 also include noise pulses produced by external disturbance light, in addition to output pulses produced by reflected light components.

Specifically, pulses in which output pulses produced by reflected light components and noise pulses produced by external disturbance light are mixed together are output from the first light-receiving unit 5 in the light emission period T3 as depicted in FIG. 5(a). Then, in the non-light emission period T4, only noise pulses are output from the first light-receiving unit 5.

In the third calculation circuit 15 depicted in FIG. 1, in the actual measurement period T1, the number of pulses of one cycle acquired by the counter 20 is calculated as described hereinafter. A value obtained by multiplying the number of fifth output pulses P5 acquired in the non-light emission period T4 by a coefficient of a predetermined time ratio (light emission period T3/non-light emission period T4) is subtracted from the number of fourth output pulses P4 acquired in the light emission period T3. That is, in the third calculation circuit 15, the number of pulses when one cycle ends (number of sixth output pulses P6) is obtained as $$P4-(P5\times(T3/T4)) \qquad \text{expression 1}$$

With regard to changes in the external environment such as external disturbance light, the light emission period T3 and the non-light emission period T4 are continuously implemented in the short period of time of one cycle. The second term of the aforementioned expression 1 derives the number of noise pulses that have occurred in the light emission period T3. By subtracting a value obtained by multiplying the number of fifth output pulses P5 by the coefficient of a predetermined time ratio, from the number of fourth output pulses P4, it is possible to obtain only pulses produced by reflected light in the light emission period T3.

Furthermore, it is desirable for the light emission period T3 and the non-light emission period T4 to be set so that the light emission period T3 is greater than the non-light emission period T4. It is thereby possible to increase the ratio with respect to one cycle of the light emission period T3 in which the light-emitting element 3 repeatedly emits pulsed light in one cycle, and it is therefore possible to reduce time loss due to the non-light emission period T4 in which only noise pulses are generated.

n cycles are implemented within the actual measurement period T1, and the number of sixth output pulses P6 according to the third calculation circuit 15 when the n cycles end is calculated by means of expression 2 below.

[Math. 1]

$$\sum_{k=1}^{n} \{P4\_k - P5\_k \times (t_4/t_5)\} \qquad (2)$$

Here, P4_$k$ indicates the number of fourth output pulses P4 acquired in the light emission period T3 of the kth cycle, and P5_$K$ indicates the number of fifth output pulses P5 acquired in the non-light emission period T4 of the kth cycle. The number of output pulses (number of sixth output pulses P6) produced by reflected light components when the n cycles end is calculated by the number of pulses being added by the third calculation circuit 15.

Next, a description will be given regarding a case where the cover panel 4 is present near the front of the light-receiving/emitting surfaces pertaining to the light-emitting element 3 and the first light-receiving unit 5 provided in the optical sensor 1.

FIG. 4(b) is a waveform chart of a lock state of the first DLL circuit 13. As depicted in FIG. 4(b), the waveform produced when the first light-receiving unit 5 has received light (received light waveform) includes two waveforms of the components of cover panel reflected light L2 from the cover panel 4 and the components of target object reflected light L1 from the target object 19 to be detected, and the two waveforms are output being offset by an amount of time corresponding to a difference in distance on the spatial optical path.

The integral value for IB in the IB integral representation in FIG. 4(b) and the integral value for IA in the IA integral representation in FIG. 4(b) coincide in a case where the rising edge of the delay signal DLL1_PULSE has occurred in a location where a waveform obtained by integrating the waveforms of first received light pulse signals SPAD_SG1 which are generated in a temporally random manner is divided equally into two with respect to a received light waveform. Therefore, this state becomes a lock state.

The waveform produced when the second light-receiving unit 10 has received light (received light waveform), despite being the two waveforms of the components of cover panel reflected light L2 from the cover panel 4 and reflected light components (including direct light) from inside the package of the optical sensor 1, is equal to the received light waveform of FIG. 4(a) since the distances on the spatial optical path are both equal to approximately zero.

FIG. 4(b) signifies that, due to the magnitudes of the components of the cover panel reflected light L2 from the cover panel 4 and the components of the target object reflected light L1 from the target object 19 to be detected, the locations of rising edges of the delay signal DLL1_PULSE in the lock state of the first DLL circuit 13 are different (the locations in the lock state of the second DLL circuit 14 are equal), and correct time difference extraction cannot be carried out.

For correct time difference extraction, it is necessary to infer the locations in the lock state of the first DLL circuit 13 when the cover panel 4 is not present. For that purpose, it is necessary to know the number of sixth output pulses P6 produced by reflected light components calculated by the third calculation circuit 15 (including components of the cover panel reflected light L2 produced by the cover panel 4 and components of the target object reflected light L1 produced by the target object 19), and a count value for the components of the cover panel reflected light L2 from the cover panel 4 (crosstalk value).

In a "determination period" described later, in a case where it is determined by the determination circuit 6 that it is possible to update the crosstalk value, the crosstalk value retained in advance is updated, and it is thereby possible to use the crosstalk value for the most up-to-date state of the cover panel 4.

(Operation of Optical Sensor 1 in Determination Period T2)

The count value corresponding to the components of the cover panel reflected light L2 from the cover panel 4 (crosstalk value) is obtained by counting the number of SPAD output pulses from the first light-receiving unit 5 for reflected light components in a fixed period, in a state in which there are no reflected light components other than components of the cover panel reflected light L2 from the cover panel 4 in front of the first light-receiving unit 5.

A description will be given regarding a case where the number of n counters 7 is 4 and m=3 for the m types of different frequency conditions for the reference pulse signal TX. First, consideration will be given to an operation in the light emission period T3 for one condition from among the three types of frequency conditions in a case where there is no target object other than the cover panel 4 in front of the first light-receiving unit 5.

Figure 6:
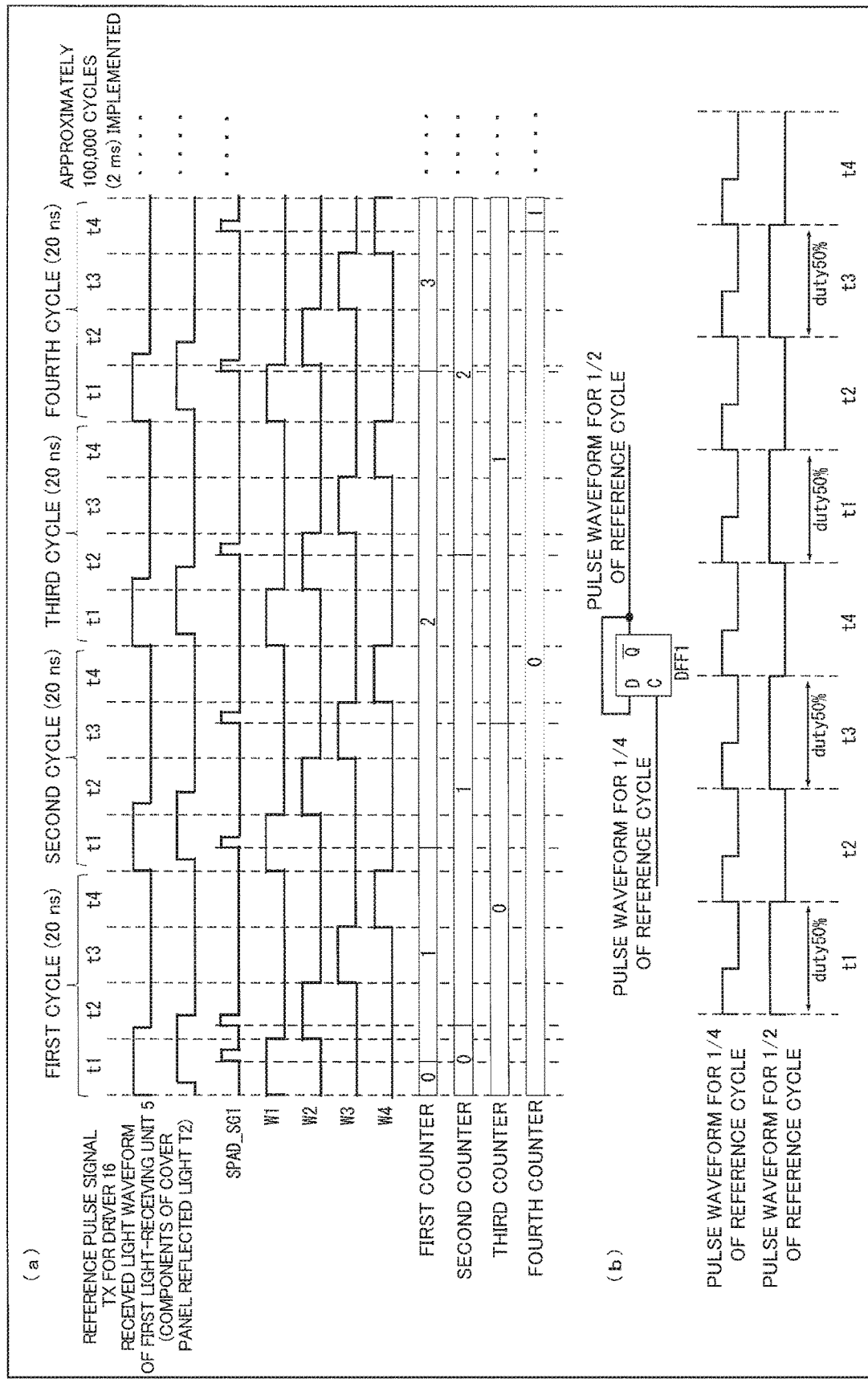
FIGS. 6(a) and (b) are waveform charts for describing an operation in a determination period of four counters provided in the optical sensor.

FIGS. 6(a) and (b) are waveform charts for describing an operation in the determination period T2 of the four counters 7 provided in the optical sensor 1. A description will be given of a state in which there is no target object other than the cover panel 4 in front of the first light-receiving unit 5.

The reference pulse generation circuit 2 provided in the optical sensor 1 depicted in FIG. 1 supplies the reference pulse signal TX to the driver 16 in the light emission period T3 in the determination period T2. The light-emitting element 3 then emits pulsed light by means of the driver 16 in a manner similar to that in the actual measurement period T1. It should be noted that the cycle of the reference pulse signal TX output to the driver 16 by the reference pulse generation circuit 2 and the reference cycle Tb output to the time difference extraction circuit 12 by the reference pulse generation circuit 2 may be the same cycle. In the present embodiment, it is assumed that the cycle of the reference pulse signal TX and the reference cycle Tb are the same cycle.

As depicted in FIG. 6(a), components of the cover panel reflected light L2 (received light waveform of the first light-receiving unit 5) become a waveform that is delayed by a fixed time with respect to the reference pulse signal TX because of the occurrence of a delay in light being emitted by the light-emitting element 3 due to a delay in the reference pulse signal TX being received.

In the present embodiment, the width of the reference pulse signal TX is adjusted so that components of the cover panel reflected light L2 are received within the first period t1 and a second period t2 and not received in a third period t3 and a fourth period t4.

The periods (first period t1 to fourth period t4) are obtained by dividing each cycle (first cycle, second cycle, third cycle, fourth cycle, . . . ) of the reference pulse signal TX obtained from the reference pulse generation circuit 2 and having the same cycle as the reference cycle Tb into four equal parts. In the periods, a waveform W1 in which the first period has a high voltage, a waveform W2 in which the second period has a high voltage, a waveform W3 in which the third period has a high voltage, and a waveform W4 in which the fourth period has a high voltage are used. The first received light pulse signal SPAD_SG1 that is output from the first light-receiving unit 5 in the periods t1 to t4 is counted by the four counters 7 (the first to fourth counters).

It should be noted that each divided period waveform (waveforms W1 to W4) of the first period t1 to the fourth period t4 obtained by dividing the reference cycle Tb into four equal parts is generated being divided by a pulse of a cycle that is ¼ of the reference cycle Tb, and as a result the first period t1 to the fourth period t4 can be made to be equal periods.

A pulse waveform that is ¼ of the reference cycle Tb is input to an arithmetic unit DFF1 depicted in FIG. 6(b), and it is thereby possible to generate a pulse waveform that is ½ of the reference cycle Tb having a duty of 50%, without depending on the duty of a pulse waveform that is ¼ of the reference cycle Tb. A pulse waveform that is ½ of the reference cycle Tb is a period in which the high period and low period are equal, and therefore the first period t1 to the fourth period t4 can be made to be equal periods by assigning the first period t1 to the fourth period t4 to each H and L period.

In FIG. 6(a), the first received light pulse signals SPAD_SG1 that are output from the first light-receiving unit 5 include pulses that are synchronized with the received light waveform of the first light-receiving unit 5 (pulses produced by the cover panel reflected light L2 from the cover panel 4 due to the light-emitting element 3) and noise pulses that are not synchronized with the waveform received by the first light-receiving unit 5 generated by external disturbance light or thermally generated carriers.

Figure 7:
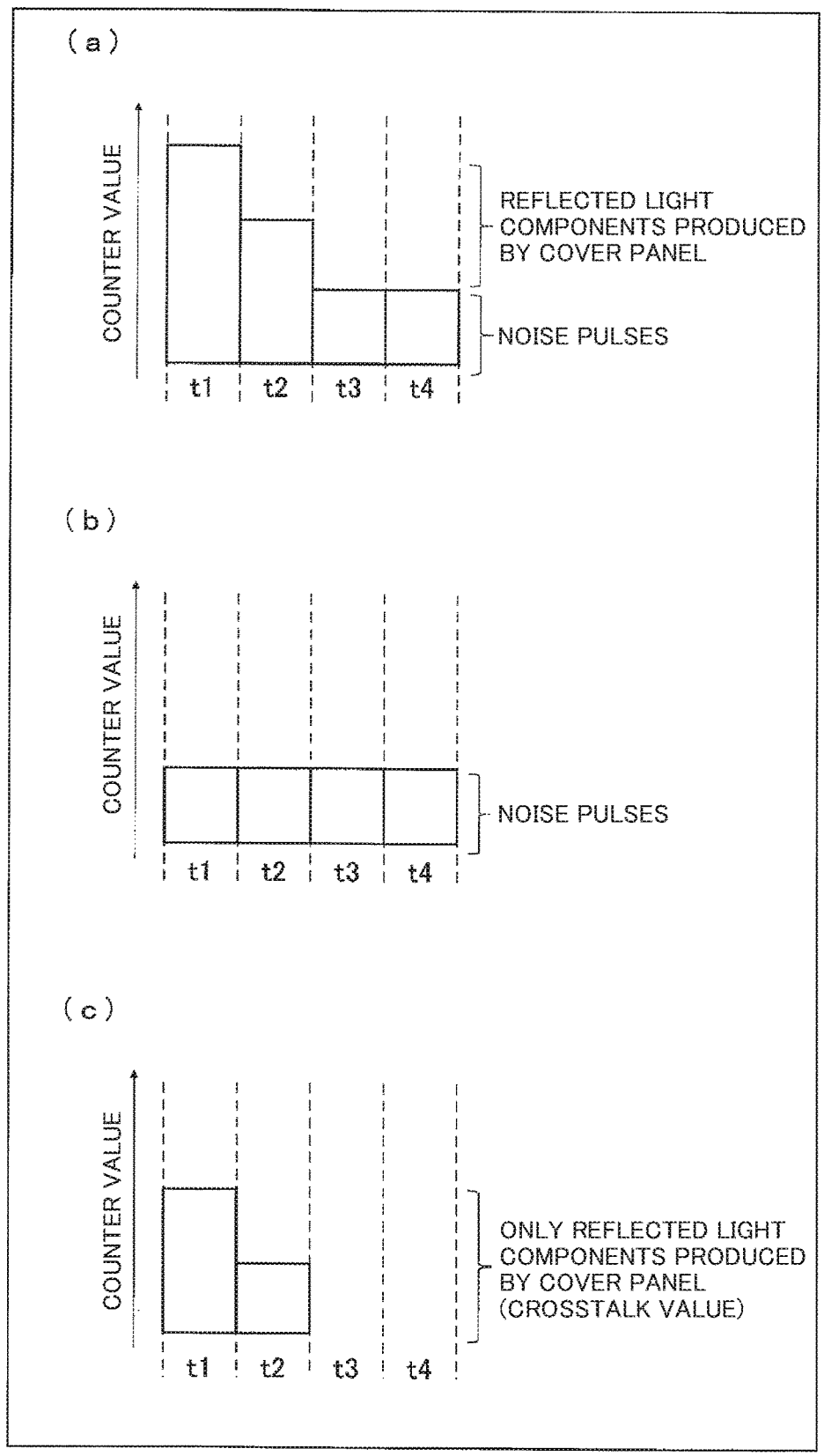
FIG. 7(a) is a histogram depicting the number of first output pulses counted in the light emission period of the determination period by the four counters.
FIG. 7(b) is a histogram depicting the number of second output pulses counted in the non-light emission period of the determination period by the four counters.
FIG. 7(c) is a histogram depicting the number of third output pulses obtained by subtracting the number of second output pulses from the number of first output pulses.

FIG. 7(a) is a histogram depicting the number of first output pulses P1 counted in the light emission period T3 included in the determination period T2 by the four counters 7, FIG. 7(b) is a histogram depicting the number of second output pulses P2 counted in the non-light emission period T4 included in the determination period T2 by the four counters 7, and FIG. 7(c) is a histogram depicting the number of third output pulses P3 obtained by subtracting the number of second output pulses P2 from the number of first output pulses P1.

As depicted in FIG. 7(a), this histogram depicts count values (number of first output pulses P1) in the first period t1 to the fourth period t4 in each cycle of the light emission period T3 included in the determination period T2. It is not possible to differentiate between pulses that are synchronized with the received light waveform of the first light-receiving unit 5 and noise pulses. However, noise pulses are generated equally in each period in both periods in which a received light waveform is obtained and periods in which a received light waveform is not obtained, whereas pulses that are synchronized with a received light waveform are generated only in the first period t1 and the second period t2 in which a received light waveform is obtained. Therefore, in the count values in the first period t1 to the fourth period t4, the count values in the first period t1 and the second period t2 become count values that are large compared to the count values in the third period t3 and the fourth period t4.

Next, consideration will be given to an operation in the non-light emission period T4 under one condition from among the three types of frequency conditions in a case where there is no target object other than the cover panel 4 in front of the first light-receiving unit 5.

FIG. 7(b) is a histogram of counter values in the target object determination circuit 17 provided in the optical sensor 1 in the non-light emission period T4. In the non-light emission period T4, an operation that is similar to that in the light emission period T3 is carried out with the reference pulse signal TX to the driver 16 depicted in FIG. 6(a) being fixed to low and the light-emitting element 3 not emitting light. The ratio between the light emission period T3 and the non-light emission period T4 is arbitrary. FIG. 7(b) depicts a case where the light emission period T3=the non-light emission period T4.

As depicted, this histogram indicates count values (the number of second output pulses P2) in the first period t1 to the fourth period t4 in the non-light emission period T4 included in the determination period T2. Since there are no pulses that are synchronized with a received light waveform of the first light-receiving unit 5, only noise pulses are generated equally in each period t1 to t4.

In a case where the count values of FIG. 7(b) are subtracted from the count values of FIG. 7(a) (the number of third output pulses P3) on the basis of the ratio between the light emission period T3 and the non-light emission period T4 of the light-emitting element 3, and there is no target object other than the cover panel 4, by obtaining the sum of the aforementioned subtraction results for the first period t1 and the second period t2 in which there are components of the cover panel reflected light L2 produced by the cover panel 4, it becomes possible to calculate a count value (pulse count value synchronized with the received light waveform, crosstalk value) for the components of the cover panel reflected light L2 produced by the cover panel 4.

It should be noted that a count acquisition period implemented by repeating the first period t1 to the fourth period t4 of FIG. 6(a) is approximately 2 milliseconds (ms), and the received light waveform of the first light-receiving unit 5 has a cycle of 20 nanoseconds (ns); consequently, the count acquisition period includes approximately 100,000 cycles of the received light waveform of the first light-receiving unit 5.

In FIG. 6(a), to simplify the explanation, the detection incidence of the first received light pulse signal SPAD_SG1 that is output from the first light-receiving unit 5 is drawn to be higher than in reality; however, the detection incidence of the first received light pulse signal SPAD_SG1 based on components of the cover panel reflected light L2 produced by the cover panel 4 actually remains at the level of several tens of counts in the 2 ms of the count acquisition period implemented by repetition mentioned above. In a case where the target object 19 to be detected is present, the detection incidence of the first received light pulse signal SPAD_SG1 based on components of the target object reflected light L1 produced by the target object 19 is of the level of zero counts to several thousands of counts depending on the distance to the target object 19. To improve measurement accuracy, the count acquisition period (2 ms) according to the first period t1 to the fourth period t4 is repeated multiple times, and in each period t1 to t4, an average value of the count values acquired by repeating acquisition multiple times may be used.

The aforementioned crosstalk value calculation method is effective when there is no target object 19 other than the cover panel 4; however, there are cases where a correct value is not obtained when a target object 19 is present.

Hereinafter, consideration will be given to an operation under one condition from among the three types of frequency conditions in a case where the target object 19 is present as well as the cover panel 4 in front of the first light-receiving unit 5.

Figure 8:
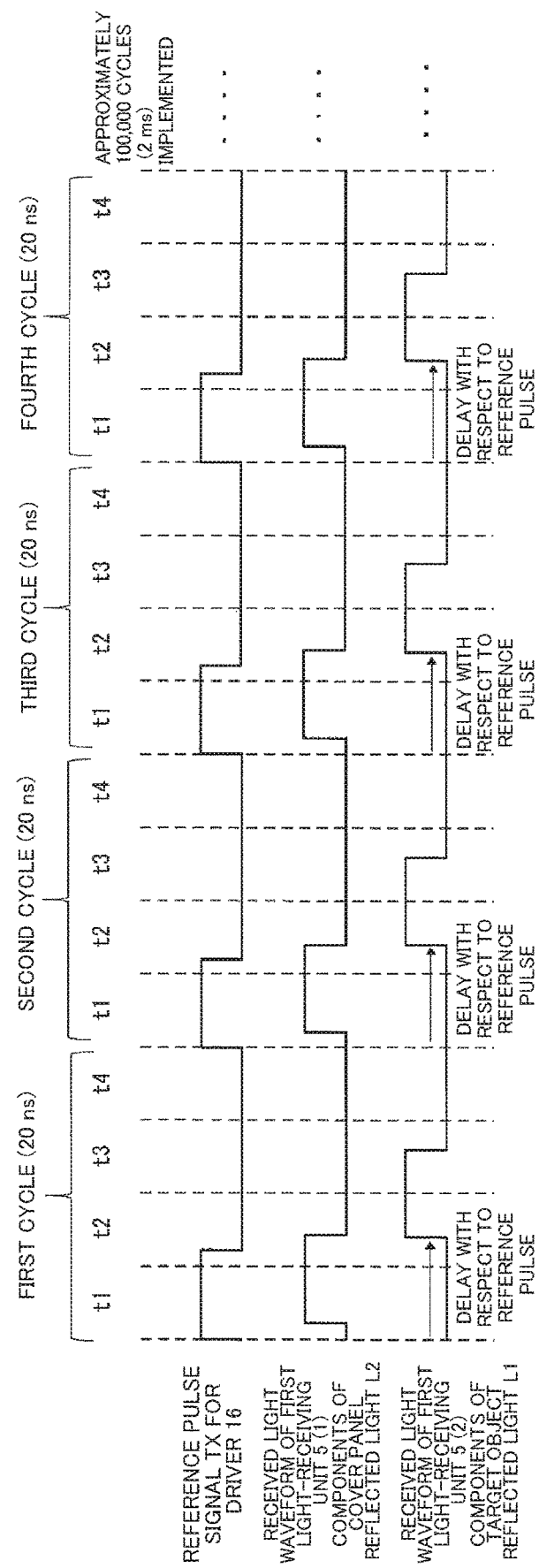
FIG. 8 is waveform chart for describing reflected light components in the determination period.

FIG. 8 is waveform chart for describing reflected light components in the determination period T2. FIG. 8 depicts a case where components of the target object reflected light L1 from the target object 19 are in the second period t2 and the third period t3 in addition to components of the cover panel reflected light L2.

FIG. 9(a) is a histogram depicting the number of first output pulses P1 when the target object reflected light L1 is received by the first light-receiving unit 5, FIG. 9(b) is a histogram depicting the number of second output pulses P2, and FIG. 9(c) is a histogram depicting the number of third output pulses P3 obtained by subtracting the number of second output pulses P2 from the number of first output pulses P1.

A histogram of counter values in the target object determination circuit 17 in the light emission period T3 is depicted in FIG. 9(a), and a histogram of counter values in the target object determination circuit 17 in the non-light emission period T4 is depicted in FIG. 9(b).

Figure 9:
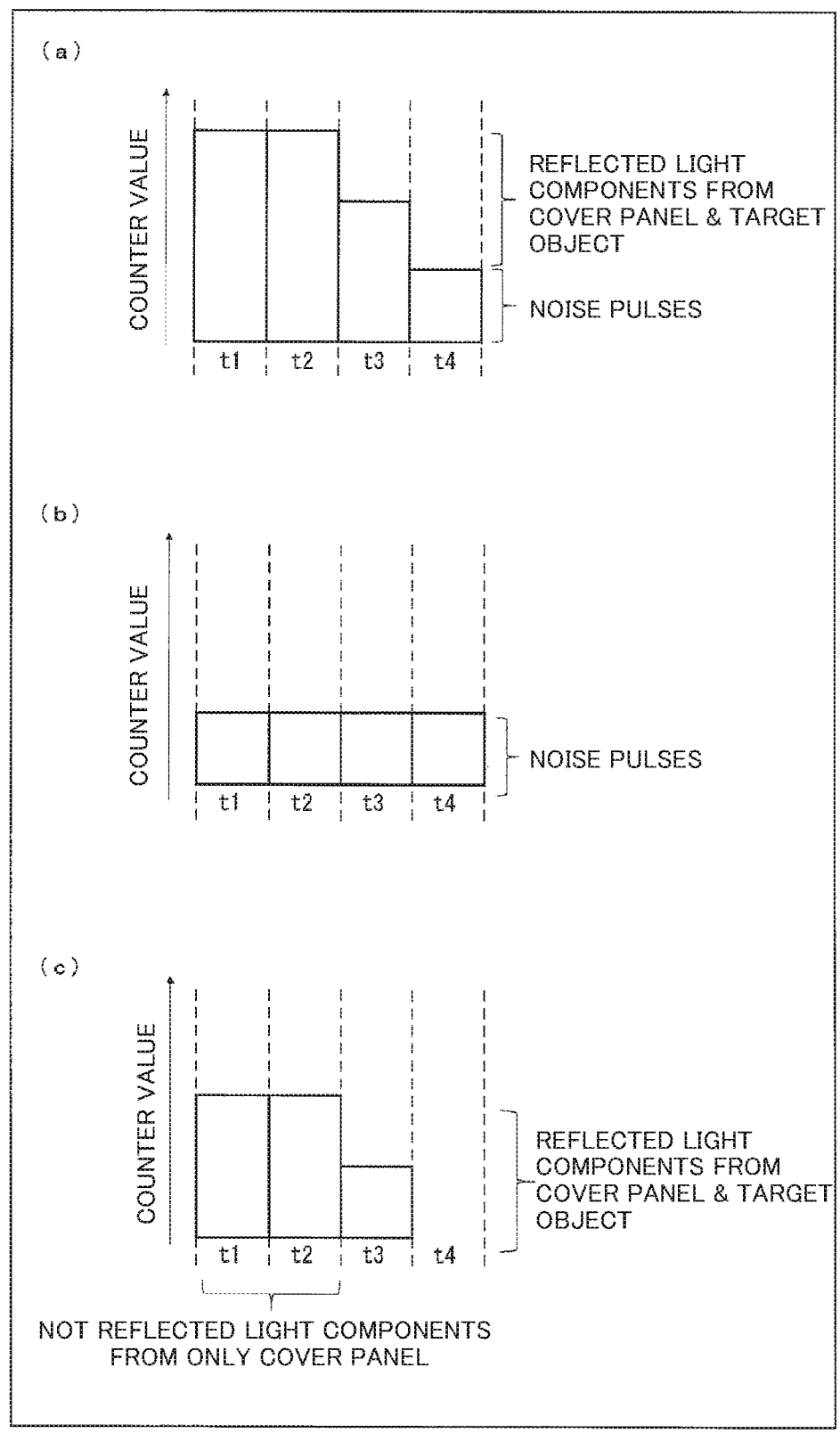
FIG. 9(a) is a histogram depicting the number of first output pulses when target object reflected light is received by a first light-receiving element.
FIG. 9(b) is a histogram depicting the number of second output pulses.
FIG. 9(c) is a histogram depicting the number of third output pulses obtained by subtracting the number of second output pulses from the number of first output pulses.

In the non-light emission period T4, an operation that is similar to that in the light emission period T3 is carried out with the reference pulse signal TX to the driver 16 of FIG. 8 being fixed to low and the light-emitting element 3 not emitting light. The ratio between the light emission period T3 and the non-light emission period T4 is arbitrary. FIG. 9 depicts a case where the light emission period T3=the non-light emission period T4.

Even if the count values depicted in FIG. 9(b) are subtracted from the count values depicted in FIG. 9(a) (the number of third output pulses P3) on the basis of the ratio between the light emission period T3 and the non-light emission period T4 of the light-emitting element 3, and the sum of the aforementioned subtraction results is obtained for the first period t1 and the second period t2 in which there are components of the cover panel reflected light L2 produced by the cover panel 4, in the second period t2, count values for the cover panel reflected light L2 and count values for the target object reflected light L1 are mixed and cannot be separated. Therefore, the count value for the components of the cover panel reflected light L2 (crosstalk value) cannot be correctly calculated, and a value that is larger by an amount commensurate to the count value for the components of the target object reflected light L1 in the second period t2 is calculated.

In a case where components of the target object reflected light L1 are present in the second period t2 and the third period t3, although a correct crosstalk value cannot be calculated, out of the third period t3 and the fourth period t4 that do not include components of the cover panel reflected light L2, the subtraction result for the third period t3 is a finite value (a count value for components of the target object reflected light L1 in the third period t3), and therefore, by determining whether or not that value is greater than or equal to a fixed number X) by means of the determination circuit 6 within the target object determination circuit 17, it is possible to determine whether or not there is a target object 19 other than the cover panel 4. It is therefore possible to determine whether or not the calculated crosstalk value is a correct value. The fixed number is a value that is sufficiently small with respect to the count value for components of the cover panel reflected light L2 (crosstalk value).

Figure 10:
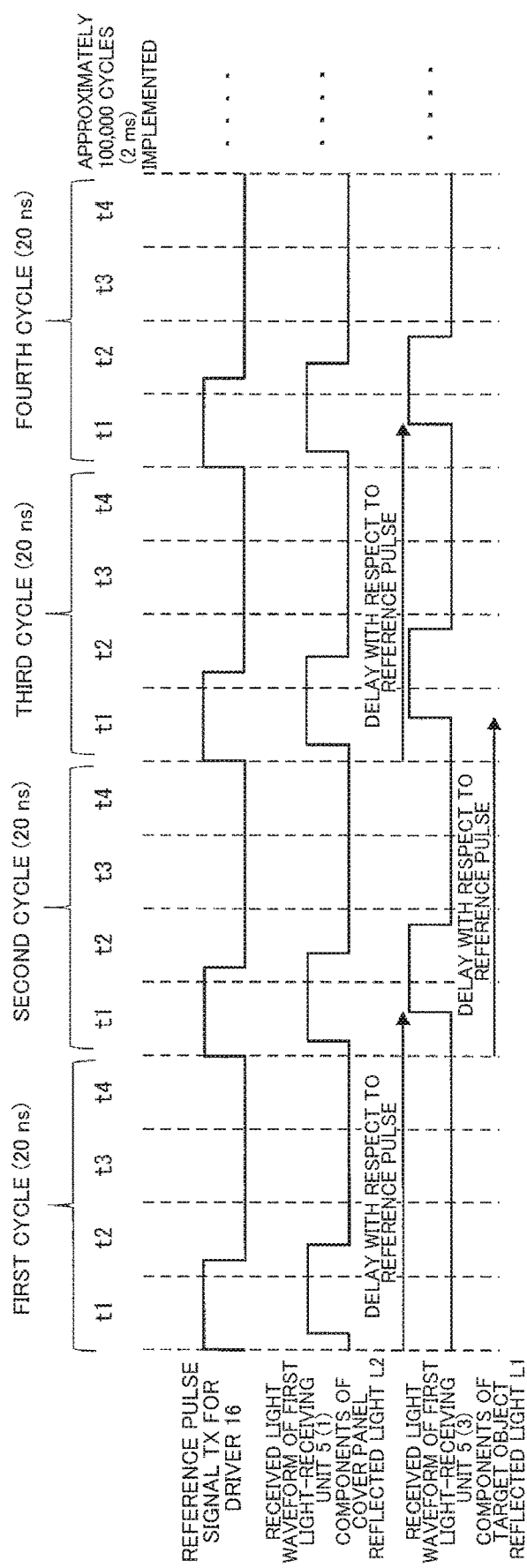
FIG. 10 is another waveform chart for describing reflected light components in the determination period.
Figure 11:
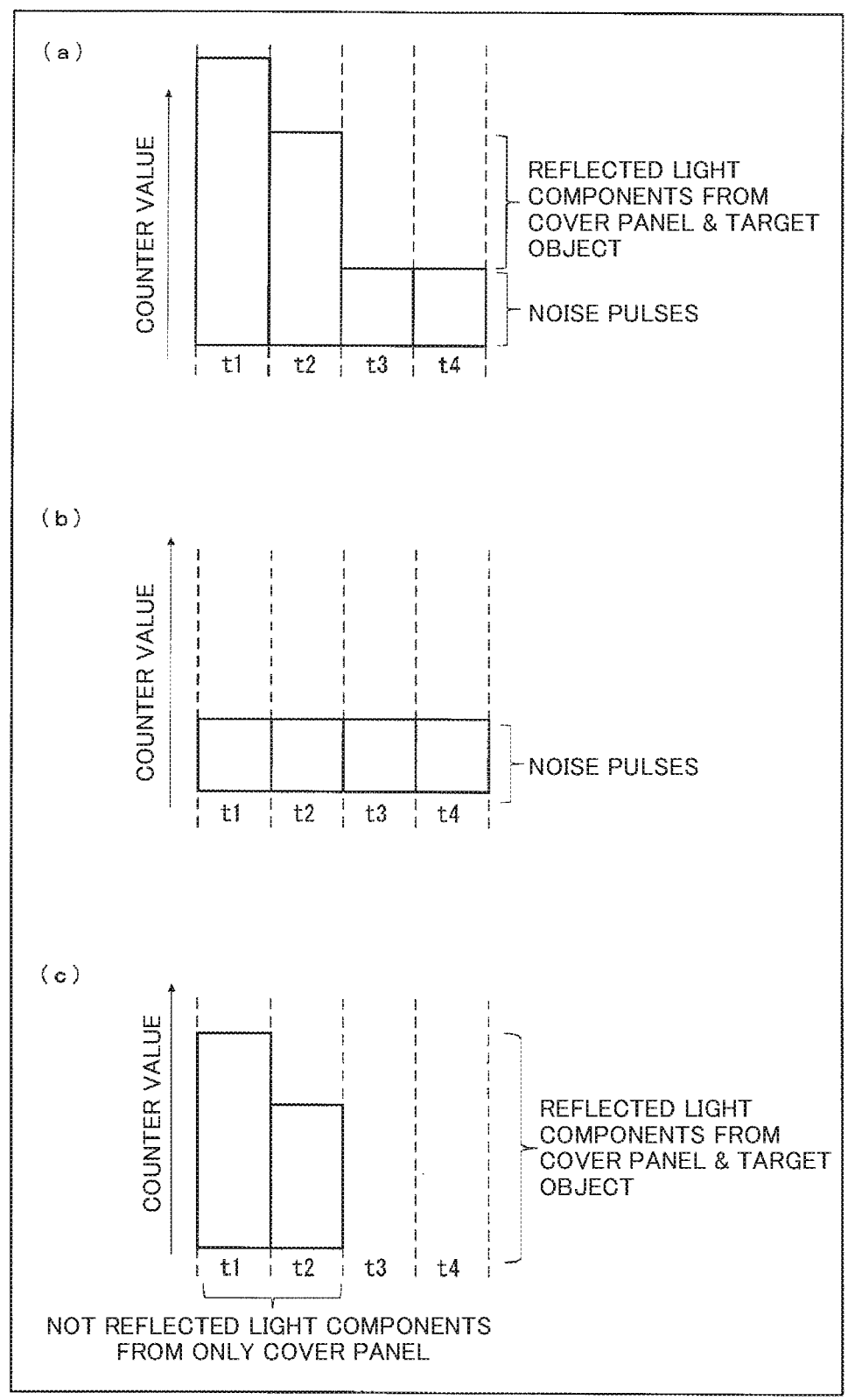
FIG. 11(a) is another histogram depicting the number of first output pulses when target object reflected light is received by the first light-receiving element.
FIG. 11(b) is another histogram depicting the number of second output pulses.
FIG. 11(c) is another histogram depicting the number of third output pulses obtained by subtracting the number of second output pulses from the number of first output pulses.

FIG. 10 is another waveform chart for describing reflected light components in the determination period T2. FIG. 11(*a*) is another histogram depicting the number of first output pulses P1 when the target object reflected light L1 is received by the first light-receiving unit 5, FIG. 11(*b*) is another histogram depicting the number of second output pulses P2, and FIG. 11(*c*) is another histogram depicting the number of third output pulses P3 obtained by subtracting the number of second output pulses P2 from the number of first output pulses P1.

Next, consideration will be given to a case where components of the target object reflected light L1 are in the first period t1 and the second period t2 in addition to components of the cover panel reflected light L2. Then, consideration will be given to a case where a delay in the components of the target object reflected light L1 with respect to the reference pulse signal TX is greater than or equal to one cycle (a delay on the spatial optical path being greater than or equal to 20 ns). When within one cycle, the distance to the target object 19 is a sufficiently short distance, and therefore the count values of the counters 7 in the first period t1 and the second period t2 become extremely large values with respect to the order of the count value for components of only the cover panel reflected light L2. It is therefore possible to determine that the target object 19 is present.

A histogram of counter values in the target object determination circuit 17 in the light emission period T3 is depicted in FIG. 11(*a*), and a histogram of counter values in the target object determination circuit 17 in the non-light emission period T4 is depicted in FIG. 11(*b*).

In the non-light emission period T4, an operation that is similar to that in the light emission period T3 is carried out with the reference pulse signal TX to the driver 16 of FIG. 10 being fixed to low and the light-emitting element 3 not emitting light. The ratio between the light emission period T3 and the non-light emission period T4 is arbitrary. FIG. 11 depicts a case where the light emission period T3=the non-light emission period T4. Even if the count values of FIG. 11(*b*) are subtracted from the count values of FIG. 11(*a*) (the number of third output pulses P3) on the basis of the ratio between the light emission period T3 and the non-light emission period T4 of the light-emitting element 3, and the sum of the aforementioned subtraction results is obtained for the first period t1 and the second period t2 in which there are components of the cover panel reflected light L2, in the first period t1 and the second period t2, count values for the cover panel reflected light L2 and count values for components of the target object reflected light L1 are mixed and cannot be separated. Therefore, the count value for the components of the cover panel reflected light L2 (crosstalk value) cannot be correctly calculated, and a value that is larger by an amount commensurate to the count value for the components of the target object reflected light L1 is calculated.

In a case where components of the target object reflected light L1 are present in the first period t1 and the second period t2, a correct crosstalk value cannot be calculated, and the subtraction result for the third period t3 and the fourth period t4 that do not include components of the cover panel reflected light L2 also does not include reflected light components, and therefore that values is less than the fixed number X. Therefore, there is a problem in that it is determined that there is no target object 19 other than the cover panel 4 by the determination circuit 6 within the target object determination circuit 17, and it is erroneously determined that the calculated crosstalk value is correct.

(Frequency Conditions)

With regard to the aforementioned problem, it is possible to prevent an erroneous determination by carrying out a similar operation under m types of frequency conditions (m≥2).

Figure 12:
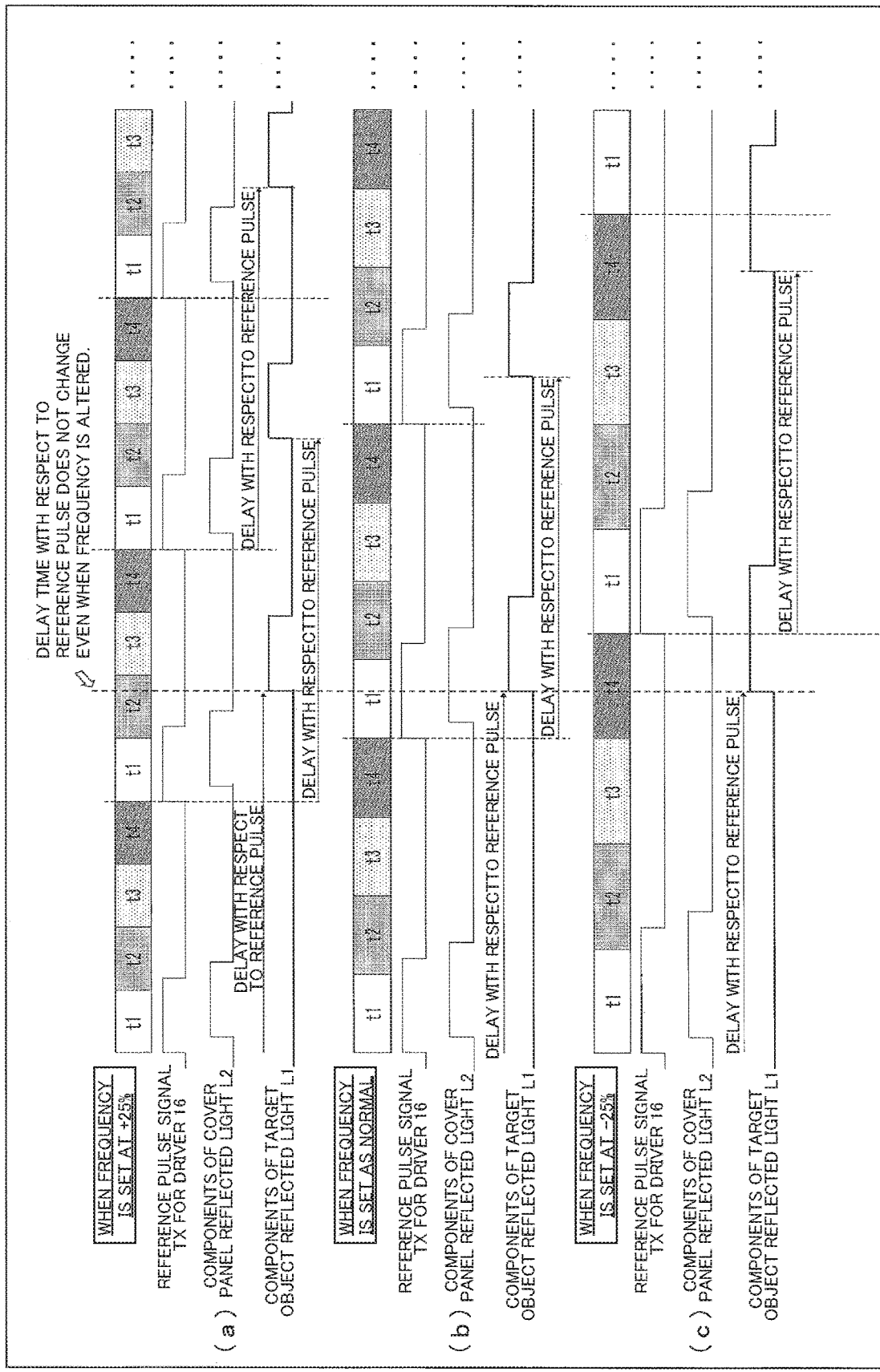
FIG. 12(a) is a waveform chart depicting reflected light components when the frequency is set to +25%.
FIG. 12(b) is a waveform chart depicting reflected light components when the frequency is set to normal.
FIG. 12(c) is a waveform chart depicting reflected light components when the frequency is set to −25%.

A case where m=3 will be described. FIG. 12 is a drawing that depicts a case where the frequency is set to +25% (condition 2) and a case where the frequency is set to −25% (condition 3), when one from among three frequency conditions (when the frequency is set as normal: condition 1) is as depicted in FIG. 10 (when components of the target object reflected light L1 are present in the first period t1 and the second period t2 in addition to components of the cover panel reflected light L2).

It is assumed that the pulse width of the reference pulse signal TX is adjusted so that components of the cover panel reflected light L2 are received in the first period t1 and the second period t2 in any of the frequencies of the three conditions, and are not received in the third period t3 or the fourth period t4.

The delay time of components of the target object reflected light L1 with respect to the reference pulse signal TX does not change even if the frequency is changed. In other words, the relationship between a delay in light being emitted by the light-emitting element 3 due to a delay in the reference pulse signal TX being received, and a delay time on the spatial optical path of components of the target object reflected light L1 does not change regardless of the frequency. Therefore, in a case where components of the target object reflected light L1 have been received in the first period t1 and the second period t2 when the frequency is set as normal (condition 1), components of the target object reflected light L1 are received in the second period t2 and the third period t3 when the frequency is +25% (condition 2), and components of the target object reflected light L1 are received in the first period t1 and the fourth period t4 when the frequency is −25% (condition 3).

Within the third period t3 and the fourth period t4 that do not include components of the cover panel reflected light L2, when the frequency is +25%, the subtraction result in the third period t3 becomes a finite value (count value for components of the target object reflected light L1 in the third period t3). Then, when the frequency is −25%, the subtraction result in the fourth period t4 becomes a finite value (count value for components of the target object reflected light L1 in the fourth period t4). Therefore, for each measurement under the three types of frequency conditions, if the determination circuit 6 within the target object determination circuit 17 determines whether or not the sum of the subtraction results for the third period t3 and the fourth period t4 is greater than or equal to the fixed value (≥X1 . . . ≥X3 (different according to the condition; since the measurement time is different according to the frequency)), a correct determination can be carried out when the target object is present when the frequency is +25% and −25%. Here, the fixed value is a value that is sufficiently small with respect to the count value for components of the cover panel reflected light L2 (crosstalk value).

In a case where it is determined that there is no target object under any of the three frequency conditions, a count value for components of the cover panel reflected light L2 (crosstalk value) can be calculated from values for the subtraction results in the first period t1 and the second period t2.

When calculating the crosstalk value, if the time in which the count value is measured is time-converted from the pulse width of the reference pulse signal TX using the result for any of the frequency conditions from among the three types of frequency conditions, it is possible to calculate the crosstalk value used in the actual measurement period T1.

Embodiment 2

Another embodiment of the present invention is as follows when described on the basis of FIGS. 13 and 14. It should be noted that, for convenience of the description, members having the same functions as the members described in the aforementioned embodiment are denoted by the same reference signs and descriptions thereof are omitted.

Figure 13:
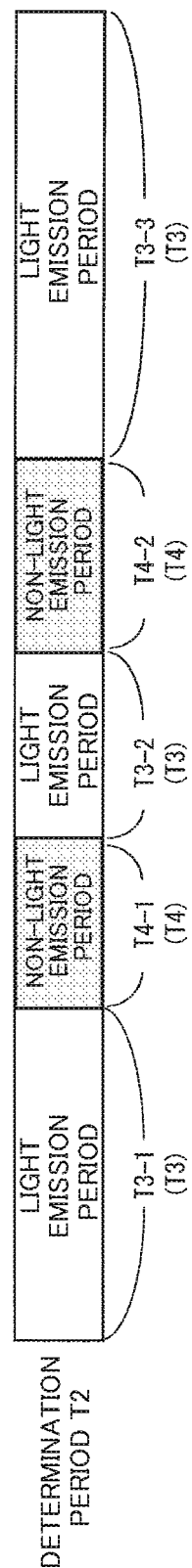
FIG. 13 is a drawing depicting a light emission period and a non-light emission period of an optical sensor according to embodiment 2.

FIG. 13 is a drawing depicting the light emission period T3 and the non-light emission period T4 of an optical sensor according to embodiment 2. Compared to embodiment 1, there are differences in that the light emission period T3 is divided into a plurality of periods and the non-light emission period T4 is divided into a plurality of periods, and the remaining configuration is the same as embodiment 1.

In embodiment 2, as depicted in FIG. 13, the light emission period T3 and the non-light emission period T4 are divided and implemented in an alternating manner. Specifically, the light emission period T3 is divided into three light emission periods T3-1, T3-2, and T3-3 in the determination period T2. The non-light emission period T4 is divided into two non-light emission periods T4-1 and T4-2. The divided light emission periods T3-1, T3-2, and T3-3 and the non-light emission periods T4-1 and T4-2 are implemented in an alternating manner as depicted in FIG. 13.

The total of the light emission periods T3 is (T3=(T3-1)+(T3-2)+(T3-3)). The total of the non-light emission periods T4 is (T4=(T4-1)+(T4-2)). The ratio between the light emission periods T3 and the non-light emission periods T4 in the determination period T2 is decided using a predetermined time ratio.

To improve measurement accuracy in an external disturbance light environment, it is desirable for a measurement interval in the light emission periods T3 and a measurement interval in the non-light emission periods T4 to be set to be as short as possible to the extent that the measurement environment does not change.

By carrying out measurements with the light emission period T3 and the non-light emission period T4 being divided in this way, it becomes possible to further shorten each measurement time in the light emission period T3 and the non-light emission period T4 compared to the case where the light emission period T3 and the non-light emission period T4 are implemented once each without being divided, under each frequency condition in the determination period T2 of embodiment 1.

Figure 14:
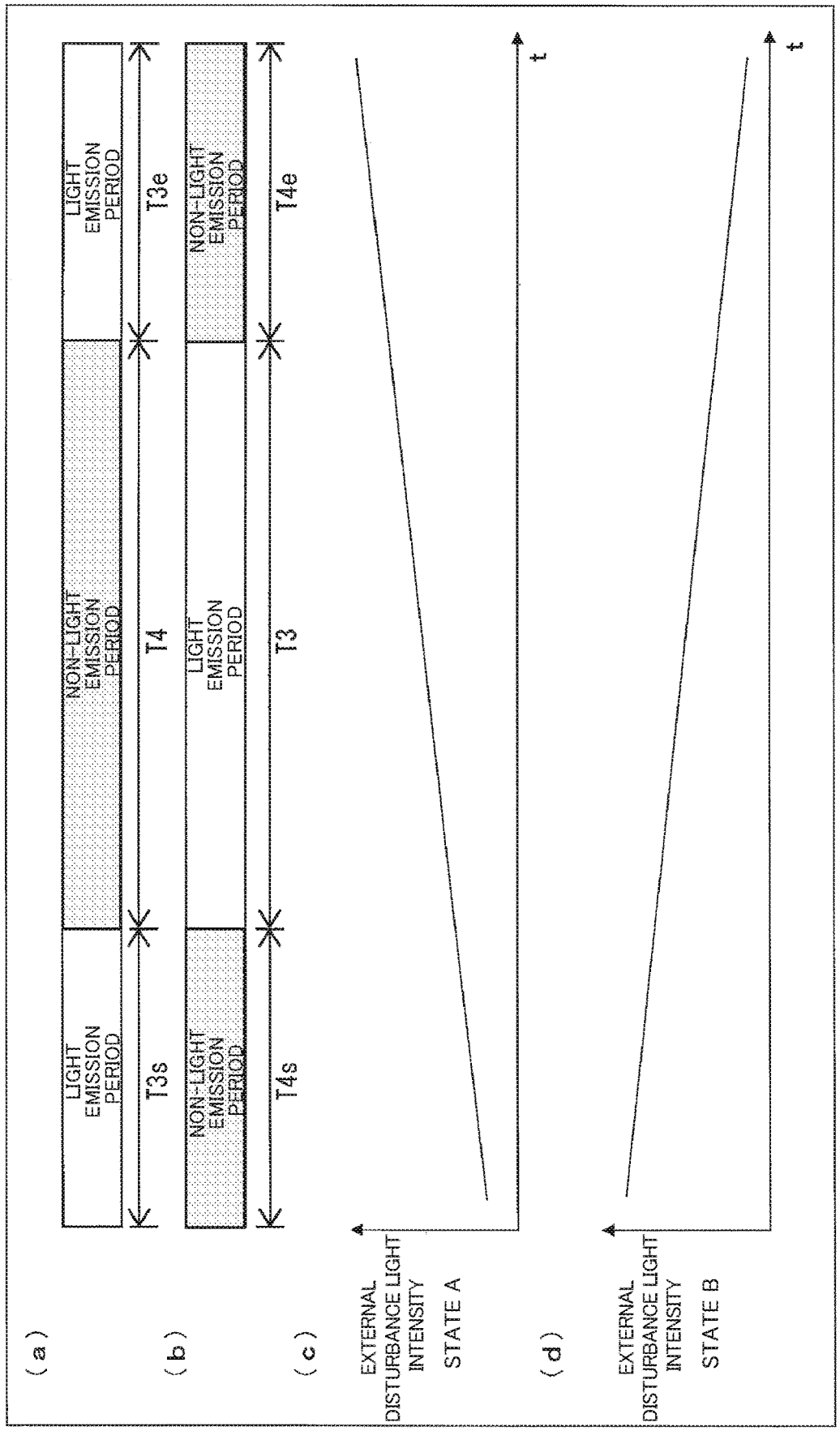
FIGS. 14(a) to (d) are drawings for describing a start light emission period, an end light emission period, a start non-light emission period, and an end non-light emission period of the optical sensor.
Figure 16:
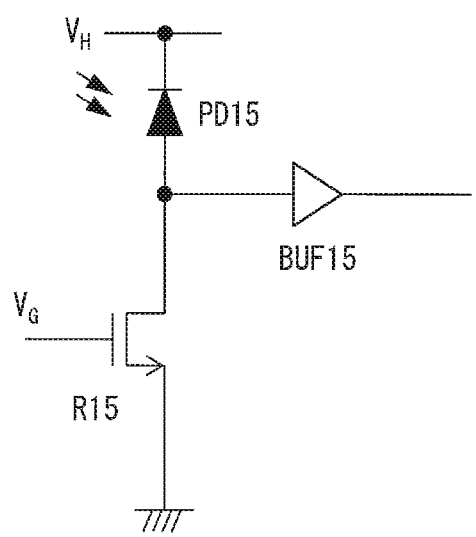
FIG. 16 is a circuit diagram depicting an example configuration of a light-receiving unit that uses a Geiger-mode avalanche photodiode.

FIGS. 14($a$) to ($d$) are drawings for describing a start light emission period T3$s$, an end light emission period T3$e$, a start non-light emission period T4$s$, and an end non-light emission period T4$e$ of the optical sensor 1.

When implemented with divisions, as depicted in FIG. 14($a$), a light emission period is arranged at the end when a light emission period is arranged at the start, and as depicted in FIG. 14($b$), a non-light emission period is arranged at the end when a non-light emission period is arranged at the start. It is thereby possible to improve measurement accuracy in an environment in which the amount of external disturbance light changes in a temporally linear manner.

In this way, in determination period T2, the light emission period T3 is implemented being divided into at least the two periods of the start light emission period T3$s$ which is implemented first and the end light emission period T3$e$ which is implemented last, or the non-light emission period T4 is implemented being divided into at least the two periods of the start non-light emission period T4$s$ which is implemented first and the end non-light emission period T4$e$ which is implemented last.

In FIG. 14($a$), consideration is given to a case where the total time of the light emission period T3$s$ and the light emission period T3$e$ is equal to the non-light emission period T4. In a case where the external disturbance light intensity has state A depicted in FIG. 14($c$), the noise pulse generation incidence due to external disturbance light in the light emission period T3$s$ is low and the noise pulse generation incidence due to external disturbance light in the light emission period T3$e$ is high. The noise pulse generation incidence due to external disturbance light in the non-light emission period T4 becomes the median value of the light emission period T3$s$ and the light emission period T3$e$. It is therefore possible to remove count values that are based on noise pulse components due to external disturbance light, in a result obtained by subtracting a count value in the non-light emission period T4 from the count values in the light emission periods T3$s$ and T3$e$.

In a case where the external disturbance light intensity has state B depicted in FIG. 14($d$), the noise pulse generation incidence due to external disturbance light in the light emission period T3$s$ is high and the noise pulse generation incidence due to external disturbance light in the light emission period T3$e$ is low. The noise pulse generation incidence due to external disturbance light in the non-light emission period T4 becomes the median value of the light emission period T3$s$ and the light emission period T3$e$. Therefore, similar to state A, it is possible to remove count values that are based on noise pulse components due to external disturbance light, in a result obtained by subtracting a count value in the non-light emission period T4 from the count values in the light emission periods T3$s$ and T3$e$.

It is obvious that there is a similar effect also in the case of FIG. 14($b$) in which the light emission periods and the non-light emission period are switched.

Embodiment 3

FIG. 15($a$) is a perspective view depicting the external appearance of a smartphone 30 according to embodiment 3, and FIG. 15($b$) is a front view of the smartphone 30. The optical sensor 1 in embodiments 1 and 2 can be provided in the smartphone 30 (electronic device). The smartphone 30 is provided with: a camera 31 that captures an image of a target object; a flash 33 for illuminating the target object captured by the camera 31; and the optical sensor (TOF sensor) 1 that detects the distance to the target object captured by the camera 31. It is thereby possible to accurately detect the distance to the target object, which is required for an autofocus function of the camera 31.

SUMMARY

An optical sensor 1 according to aspect 1 of the present invention is provided with: a reference pulse generation circuit 2 that generates a reference pulse signal TX; a light-emitting element 3 that emits light toward a target object 19 on the basis of the reference pulse signal TX generated by the reference pulse generation circuit 2; a cover panel 4 that transmits a portion of the light emitted from the light-emitting element 3 and reflects the remaining portion; a photon-counting type of first light-receiving element (first light-receiving unit 5) that is provided in such a way as to be able to receive target object reflected light L1 that is reflected by the target object 19 and cover panel reflected light L2 that is reflected by the cover panel 4; and a determination circuit (target object determination circuit 17) that determines whether or not the target object reflected light L1 is received by the first light-receiving element (first light-receiving unit 5), on the basis of a first received light pulse signal SPAD_SG1 that is based on at least one of the target object reflected light L1 and the cover panel reflected light L2 received by the first light-receiving element (first light-receiving unit 5), and the reference pulse signal TX.

According to the aforementioned configuration, whether or not the target object reflected light is received by the first light-receiving element is determined on the basis of the first received light pulse signal which is based on at least one of the target object reflected light and the cover panel reflected light received by the first light-receiving element, and the reference pulse signal. Therefore, it is possible to appropriately measure the distance to the target object on the basis of time-of-flight, by appropriately updating a crosstalk value representing the amount of components of cover panel reflected light, when it is determined that the target object reflected light has not been received by the first light-receiving element.

With regard to the optical sensor 1 according to aspect 2 of the present invention, in the aforementioned aspect 1, the determination circuit (target object determination circuit 17) may have: n counters 7 that count the number of first received light pulse signals SPAD_SG1 from the first light-receiving element (first light-receiving unit 5) in each of a first period t1 to an $n^{th}$ period tn obtained by dividing a reference cycle Tb of the reference pulse signal TX into n equal parts (n being an integer that is greater than or equal to 2); and a first calculation circuit 8 that calculates, for each of m types of different frequency conditions for the reference pulse signal TX, a number of third output pulses P3 obtained by subtracting a number of second output pulses P2 representing the number of first received light pulse signals SPAD_SG1 counted by the n counters 7 in the first period t1 to the $n^{th}$ period tn of a non-light emission period T4 in which the light-emitting element 3 does not emit light, from a number of first output pulses P1 representing the number of first received light pulse signals SPAD_SG1 counted by the n counters 7 in the first period t1 to the $n^{th}$ period tn of a light emission period T3 in which the light-emitting element 3 emits light on the basis of the reference pulse signal TX, and the determination circuit (target object determination circuit 17) may determine whether or not the target object reflected light L1 is received by the first light-receiving element (first light-receiving unit 5), on the basis of m types of the number of third output pulses P3 for each of the m types of different frequency conditions for the reference pulse signal TX calculated by the first calculation circuit 8.

According to the aforementioned configuration, it is possible to determine whether or not the target object reflected light is received by the first light-receiving element, by counting the number of first received light pulse signals for each of m types of different frequency conditions.

With regard to the optical sensor 1 according to aspect 3 of the present invention, in the aforementioned aspect 2, the first period t1 to the $n^{th}$ period to obtained by dividing the reference cycle Tb into n equal parts may be generated by dividing by a pulse waveform of a cycle that is 1/n of the reference cycle Tb.

According to the aforementioned configuration, the first period t1 to the $n^{th}$ period to obtained by dividing the reference cycle Tb into n equal parts can be easily generated.

With regard to the optical sensor 1 according to aspect 4 of the present invention, in the aforementioned aspect 2, the first calculation circuit 8 may calculate the number of third output pulses P3 obtained by subtracting the number of second output pulses P2 from the number of first output pulses P1, on the basis of a ratio between the length of the light emission period T3 and the length of the non-light emission period T4.

According to the aforementioned configuration, it is possible to determine whether or not the target object reflected light is received by the first light-receiving element with consideration being given to a ratio between the length of the light emission period and the length of the non-light emission period.

The optical sensor 1 according to aspect 5 of the present invention, in the aforementioned aspect 2, may operate in an actual measurement period T1 in which the distance to the target object 19 is measured, and a determination period T2 in which it is determined whether or not the target object reflected light L1 is received by the first light-receiving element (first light-receiving unit 5), and, in the determination period T2, the light emission period T3 may be implemented being divided into at least two periods of a start light emission period T3$s$ that is implemented first and an end light emission period T3$e$ that is implemented last, or the non-light emission period T4 may be implemented being divided into at least two periods of a start non-light emission period T4$s$ that is implemented first and an end non-light emission period T4$e$ that is implemented last.

According to the aforementioned configuration, it is possible to improve measurement accuracy in an environment in which the amount of external disturbance light changes in a temporally linear manner.

The optical sensor 1 according to aspect 6 of the present invention, in the aforementioned aspect 2, may be further provided with a second calculation circuit 9 that calculates a crosstalk value representing the amount of components of the cover panel reflected light L2, on the basis of the number of third output pulses P3 corresponding to a period in which there is a first received light pulse signal SPAD_SG1 that is based on the cover panel reflected light L2, within the first period t1 to the $n^{th}$ period tn.

According to the aforementioned configuration, it is possible to appropriately update a crosstalk value representing the amount of components of cover panel reflected light.

With regard to the optical sensor 1 according to aspect 7 of the present invention, in the aforementioned aspect 6, the second calculation circuit 9 may calculate and update the crosstalk value when it is determined by the determination circuit (target object determination circuit 17) that the target object reflected light L1 has not been received by the first light-receiving element (first light-receiving unit 5).

According to the aforementioned configuration, a crosstalk value is appropriately updated, and it is therefore possible to appropriately measure the distance to a target object on the basis of time-of-flight.

The optical sensor 1 according to aspect 8 of the present invention, in the aforementioned aspect 6, may be further provided with: a photon-counting type of second light-receiving element (second light-receiving unit 10) that is arranged nearer to the light-emitting element 3 than the first light-receiving element (first light-receiving unit 5), and receives the cover panel reflected light L2, sensor package internal reflected light, and direct light from the light-emitting element 3; and a time difference extraction circuit 12 that extracts a time difference corresponding to the distance on a spatial optical path to the target object 19, including a first DLL circuit 13 having input thereto the first received light pulse signal SPAD_SG1 from the first light-receiving element (first light-receiving unit 5) and the reference cycle Tb that is based on the reference pulse signal TX, and a second DLL circuit 14 having input thereto a second received light pulse signal SPAD_SG2 from the second light-receiving element (second light-receiving unit 10) and the reference cycle Tb, and the optical sensor 1 may operate in an actual measurement period T1 in which the distance to the target object 19 is measured, and a determination period T2 in which it is determined whether or not the target object reflected light L1 is received by the first light-receiving element (first light-receiving unit 5), and may be further provided with: a third calculation circuit 15 that calculates a number of sixth output pulses P6 obtained by subtracting a number of fifth output pulses P5 representing the number of first received light pulse signals SPAD_SG1 from the first light-receiving element (first light-receiving unit 5) in the non-light emission period T4, from a number of fourth output pulses P4 representing the number of first received light pulse signals SPAD_SG1 from the first light-receiving element (first light-receiving unit 5) in the light emission period T3, in the actual measurement period T1; and a distance calculation circuit 11 that calculates the distance to the target object 19 on the basis of the number of sixth output pulses P6 calculated by the third calculation circuit 15, the time difference extracted by the time difference extraction circuit 12, and the crosstalk value calculated by the second calculation circuit 9.

According to the aforementioned configuration, it is possible to appropriately measure the distance to a target object on the basis of time-of-flight, using a DLL scheme which is advantageous in terms of resolution.

With regard to the optical sensor 1 according to aspect 9 of the present invention, in the aforementioned aspect 1, the target object 19 may include a detection target object for detecting a distance to the optical sensor 1, and a non-detection target object arranged in the direction of the light emitted from the light-emitting element 3.

According to the aforementioned configuration, it is possible to appropriately update the crosstalk value with the effect of not only reflected light produced by the detection target object but also reflected light produced by non-detection target objects being eliminated.

The present invention is not restricted to the aforementioned embodiments, various alterations are possible within the scope indicated in the claims, and embodiments obtained by appropriately combining the technical means disclosed in each of the different embodiments are also included within the technical scope of the present invention. In addition, novel technical features can be formed by combining the technical means disclosed in each of the embodiments.

REFERENCE SIGNS LIST

1 Optical sensor
2 Reference pulse generation circuit
3 Light-emitting element
4 Cover panel
5 First light-receiving unit (first light-receiving element)
6 Determination circuit
7 Counter
8 First calculation circuit
9 Second calculation circuit
10 Second light-receiving unit (second light-receiving element)
11 Distance calculation circuit
12 Time difference extraction circuit
13 First DLL circuit
14 Second DLL circuit
15 Third calculation circuit
17 Target object determination circuit (determination circuit)
19 Target object
30 Smartphone (electronic device)
L1 Target object reflected light
L2 Cover panel reflected light
T1 Actual measurement period
T2 Determination period
T3 Light emission period
T3s Start light emission period
T3e End light emission period
T4 Non-light emission period
T4s Start non-light emission period
T4e End non-light emission period
t1 First period
t2 Second period
t3 Third period
t4 Fourth period
TX Reference pulse signal
SPAD_SG1 First received light pulse signal
SPAD_SG2 Second received light pulse signal
P1 Number of first output pulses
P2 Number of second output pulses
P3 Number of third output pulses

The invention claimed is:

1. An optical sensor comprising:
a reference pulse generation circuit that generates a reference pulse signal;
a light-emitting element that emits light toward a target object on the basis of the reference pulse signal generated by the reference pulse generation circuit:
a cover panel that transmits a portion of the light emitted from the light-emitting element and reflects a remaining portion:
a photon-counting type of first light-receiving element that is provided in such a way as to be able to receive target object reflected light that is reflected by the target object and cover panel reflected light that is reflected by the cover panel; and
a determination circuit that determines whether or not the target object reflected light is received by the first light-receiving element, on the basis of a first received light pulse signal that is based on at least one of the target object reflected light and the cover panel reflected light received by the first light-receiving element, and the reference pulse signal:
wherein the determination circuit has:
n counters that count a number of first received light pulse signals from the first light-receiving element in each of a first period to an $n^{th}$ period obtained by dividing a reference cycle of the reference pulse signal into n equal parts (n being an integer that is greater than or equal to 2); and
a first calculation circuit that calculates, for each of in types of different frequency conditions for the reference pulse signal, a number of third output pulses obtained by subtracting a number of second output pulses representing the number of first received light pulse signals counted by the n counters in the first period to the $n^{th}$ period of a non-light emission period in which the light-emitting element does not emit light, from a number of first output pulses representing the number of first received light pulse signals counted by the n counters in the first period to the $n^{th}$ period of a light emission period in which the light-emitting element emits light on the basis of the reference pulse signal, and the determination circuit determines whether or not the target Object reflected light is received by the first light-receiving element, on the basis of m types of the number of third output pulses for each of the m types of different frequency conditions for the reference pulse signal calculated by the first calculation circuit.

2. The optical sensor according to claim 1, wherein the first period to the $n^{th}$ period obtained by dividing the reference cycle into n equal parts are generated by dividing by a pulse waveform of a cycle that is 1/n of the reference cycle.

3. The optical sensor according to claim 1, wherein the first calculation circuit calculates the number of third output pulses obtained by subtracting the number of second output pulses from the number of first output pulses, on the basis of a ratio between a length of the light emission period and a length of the non-light emission period.

4. The optical sensor according to claim 1, wherein the optical sensor operates in an actual measurement period in which a distance to the target object is measured, and a determination period in which it is determined whether or not the target object reflected light is received by the first light-receiving element, and, in the determination period, the light emission period is implemented being divided into at least two periods of a start light emission period that is implemented first and an end light emission period that is implemented last, or the non-light emission period is implemented being divided into at least two periods of a start non-light emission period that is implemented first and an end non-light emission period that is implemented last.

5. The optical sensor according to claim 1, further comprising a second calculation circuit that calculates a crosstalk value representing an amount of components of the cover panel reflected light, on the basis of the number of third output pulses corresponding to a period in which there is a first received light pulse signal that is based on the cover panel reflected light, within the first period to the $n^{th}$ period.

6. The optical sensor according to claim 5, wherein the second calculation circuit calculates and updates the crosstalk value when it is determined by the determination circuit that the target object reflected light has not been received by the first light-receiving element.

7. The optical sensor according to claim 5, further comprising:
a photon-counting type of second light-receiving element that is arranged nearer to the light-emitting element than the first light-receiving element, and receives the cover panel reflected light, sensor package internal reflected light, and direct light from the light-emitting element; and
a time difference extraction circuit that extracts a time difference corresponding to a distance on a spatial optical path to the target object, including a first DLL circuit having input thereto the first received light pulse signal from the first light-receiving element and the reference cycle that is based on the reference pulse signal, and a second DLL circuit having input thereto a second received light pulse signal from the second light-receiving element and the reference cycle,
wherein the optical sensor operates in an actual measurement period in which a distance to the target object is measured, and a determination period in which it is determined whether or not the target object reflected light is received by the first light-receiving element,
and further comprises:
a third calculation circuit that calculates a number of sixth output pulses obtained by subtracting a number of fifth output pulses representing the number of first received light pulse signals from the first light-receiving element in the non-light emission period, from a number of fourth output pulses representing the number of first received light pulse signals from the first light-receiving element in the light emission period, in the actual measurement period; and
a distance calculation circuit that calculates the distance to the target object on the basis of the number of sixth output pulses calculated by the third calculation circuit, the time difference extracted by the time difference extraction circuit, and the crosstalk value calculated by the second calculation circuit.

8. The optical sensor according to claim 1, wherein the target object includes a detection target object for detecting a distance to the optical sensor, and a non-detection target object arranged in the direction of the light emitted from the light-emitting element.

9. An electronic device comprising the optical sensor according to claim 1.

* * * * *